(12) United States Patent
Liang et al.

(10) Patent No.: US 7,622,344 B2
(45) Date of Patent: Nov. 24, 2009

(54) METHOD OF MANUFACTURING COMPLEMENTARY METAL OXIDE SEMICONDUCTOR TRANSISTORS

(75) Inventors: Chia-Wen Liang, Hsin-Chu (TW);
Cheng-Tung Huang, Kao-Hsiung (TW);
Shyh-Fann Ting, Tai-Nan (TW);
Chih-Chiang Wu, Taichung County (TW); Shih-Chieh Hsu, Hsinchu (TW);
Li-Shian Jeng, Tai-Tung Hsien (TW);
Kun-Hsien Lee, Tai-Nan (TW);
Meng-Yi Wu, Kaohsiung County (TW);
Wen-Han Hung, Kao-Hsiung (TW);
Tzyy-Ming Cheng, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 118 days.

(21) Appl. No.: 11/779,270

(22) Filed: Jul. 17, 2007

(65) Prior Publication Data
US 2009/0023258 A1 Jan. 22, 2009

(51) Int. Cl.
*H01L 21/8238* (2006.01)
(52) U.S. Cl. .................. 438/222; 438/199; 438/197; 257/E21.17; 257/E21.23; 257/E21.54; 257/E21.115; 257/E21.218; 257/E21.229; 257/E21.245; 257/E21.248; 257/E21.632

(58) Field of Classification Search .............. 438/9, 438/197, 199, 222, 300, 506, 297, 680, 700, 438/706, 745, 931, 933, 721
See application file for complete search history.

(56) References Cited

U.S. PATENT DOCUMENTS

| 7,135,372 | B2* | 11/2006 | Huang et al. | 438/300 |
| 7,176,522 | B2* | 2/2007 | Cheng et al | 257/338 |
| 7,381,649 | B2* | 6/2008 | Chen et al. | 438/700 |
| 2006/0051922 | A1* | 3/2006 | Huang et al. | 438/282 |
| 2007/0128786 | A1* | 6/2007 | Cheng et al. | 438/199 |
| 2008/0085577 | A1* | 4/2008 | Shih et al. | 438/199 |

\* cited by examiner

*Primary Examiner*—David Nhu
(74) *Attorney, Agent, or Firm*—Winston Hsu

(57) ABSTRACT

A method for manufacturing CMOS transistors includes an etching back process alternatively performed after the gate structure formation, the lightly doped drain formation, source/drain implantation, or SEG process to etch a hard mask layer covering and protecting a first type gate structure, and to reduce thickness deviation between the hard masks covering the first type gate structure and a second type gate structure. Therefore the damage to spacers, STIs, and the profile of the gate structures due to the thickness deviation is prevented.

22 Claims, 24 Drawing Sheets

METHOD OF MANUFACTURING COMPLEMENTARY METAL OXIDE SEMICONDUCTOR TRANSISTORS

BACKGROUND OF THE INVENTION

1. Field of the Invention

The present invention relates to methods for manufacturing complementary metal oxide semiconductor (CMOS) transistors, and more particularly, to methods for manufacturing CMOS transistors with selective epitaxial growth (SEG).

2. Description of the Prior Art

As semiconductor processes advance to very deep submicron geometries and with the progress of device miniaturization, enhancing carrier mobility and a driving current of a MOS transistor has become a critical issue. For example, manufacturing source/drain of a MOS transistor with selective epitaxial growth (SEG) technology is used to improve electrical performance of those elements. SEG technology is widely applied in manufacturing numerous kinds of semiconductor devices, such as MOS transistors having raised source/drain region which benefits from good short channel character and low parasitical resistance and a MOS transistor having recessed source/drain which improves drain induced barrier lowering (DIBL) and punchthrough effect and reduces off-state current leakage and power consumption.

Please refer to FIGS. 1-4, which are schematic drawings illustrating a conventional method for manufacturing CMOS transistors. As shown in FIG. 1, a substrate comprising a N-type well 102, a P-type well 104 and a shallow trench isolation (STI) 106 formed in between is provided. A dielectric layer and a polysilicon layer are sequentially formed on the substrate 100 (not shown). Then, a patterned hard mask layer 110 is formed on the substrate 100 and used as an etching mask. Then the polysilicon layer and the dielectric layer are etched to form gate structures 112 and 114 respectively on the N-type well 102 and the P-type well 104.

Please refer to FIG. 1 again. Next, a mask (not shown) is used in an ion implantation process to form P-type lightly doped drains (LDDs) 122 in the N-type well 102 at two sides of the gate structure 112. And another mask (not shown) is used in an ion implantation process to form N-type LDDs 124 in the P-type well 104 at two sides of the gate structure 114. Then, a spacer 126 is formed at sidewall of each gate structure 112 and 114. The spacer 126, the hard mask layer 110, and a mask covering the N-type well 102 (now shown) are used as an implantation mask in an ion implantation process to form a N-type source/drain 144 in the P-type well 104 at two sides of the gate structure 114.

Please refer to FIGS. 2-3. Next, a cap layer 130 covering the P-type well 104 is formed on the substrate 100. As shown in FIG. 3, the cap layer 130, the hard mask layer 110, and the spacer 126 are used as a mask in an etching process to form recesses 140 in the N-type well 102 respectively at two sides of the gate structure 112.

Please refer to FIG. 4. A selective epitaxial growth (SEG) process is performed to form epitaxial silicon layers 142 respectively in each recess 140. The epitaxial silicon layer 142 comprises silicon or silicon germanium (SiGe). It is well known to those skilled in the art that an ion implantation process is performed before forming the recesses 140 or after forming the epitaxial silicon layer 142 with the cap layer 130, the hard mask layer 110, and the spacer 126 being an implantation mask, thus the epitaxial silicon layer 142 can be a source/drain. To improve Ohmic contact between the gate structures 112 and 114 and the contact plugs formed afterwards, the cap layer 130 and the hard mask layer 110 are entirely removed, then a self-aligned silicide (salicide) process is performed to form silicide layers atop of the gate structures 112 and 114, and the source/drains 142 and 144.

Please refer to FIG. 4 again. In case of undesired epitaxial silicon layer formed on the exposed gate structure 112 due to exceeding consumption of the hard mask layer 110 in the etching process, the hard mask layer 110 used in SEG method is made thicker. It is noteworthy that while the hard mask layer 110 covering the gate structure 112 is getting thinner due to consumption in the etching process, the hard mask layer 110 covering the gate structure 114 is protected from consumption by the cap layer 130. Additionally, such consumption happens not only in the etching process, but also in a cleaning process after recess 140 etching, a cleaning process before SEG process, etc. Consequently, there will be a thickness deviation of about 400-500 angstroms between the hard mask layer 110 covering the gate structure 114 and the hard mask layer 110 covering the gate structure 112.

Please refer to FIGS. 5-6, which are scanning electron microscopy (SEM) pictures of a PMOS and an NMOS, respectively. As shown in FIGS. 5 and 6, because of the thickness deviation between the PMOS and the NMOS, the profile of the gate structure 112 is damaged and liner oxide of the spacers 126 is consumed when the hard mask layer 110 covering the gate structures 112 and 114 and the cap layer 130 have to be removed completely. Exceeding consumption of the liner oxide of the spacer 126 even makes the spacer 126 peeled off. Such consumption also happens to the STI 106, therefore the silicide layers may form under the STI 106 and cause current leakage.

SUMMARY OF THE INVENTION

Therefore the present invention provides a method for manufacturing complementary metal oxide semiconductor (CMOS) transistors to prevent the thickness deviation and its influence on the CMOS transistors.

According to the claimed invention, a method for manufacturing complementary metal oxide semiconductor (CMOS) transistors is provided. The method comprises steps of providing a substrate comprising at least a first type gate structure and a second type gate structure, each of the gate structures comprises a gate dielectric layer, a gate conductive layer, and a hard mask layer. Next, performing a source/drain formation process to form a first type source/drain area in the substrate at two sides of the first type gate structure and a second type source/drain area in the substrate at two sides of the second type gate structure, performing an etching back process to etch back and thin down the hard mask layer covering the first type gate structure, performing an etching process to form recesses in the substrate respectively at two sides of the second type gate structure through a patterned cap layer, and performing a selective epitaxial growth (SEG) process to form epitaxial silicon layers in each recess.

According to the claimed invention, another method for manufacturing CMOS transistors is provided. The method comprises steps of providing a substrate comprising at least a first type gate structure and a second type gate structure, each of the gate structures comprises a gate dielectric layer, a gate conductive layer, and a hard mask layer. Next, performing a lightly doped drain (LDD) implantation process to form first type LDDs in the substrate at two sides of the first type gate structure and second type LDDs in the substrate at two sides of the second type gate structure, performing an etching back process to etch back and thin down the hard mask layer covering the first type gate structure, performing a source/drain formation process to form a first type source/drain area in the substrate at two sides of the first type gate structure and a second type source/drain area in the substrate at two sides of the second type gate structure, performing an etching process to form recesses in the substrate respectively at two sides of the second type gate structure through a patterned cap layer, and performing a SEG process to form epitaxial silicon layers in each recess.

According to the claimed invention, another method for manufacturing CMOS transistors is provided. The method comprises steps of providing a substrate comprising at least a first type gate structure and a second type gate structure, each of the gate structures comprises a gate dielectric layer, a gate conductive layer, and a hard mask layer. Next, performing a LDD implantation process to form first type LDDs in the substrate at two sides of the first type gate structure and second type LDDs in the substrate at two sides of the second type gate structure, performing an etching process to form recesses in the substrate respectively at two sides of the second type gate structure through a patterned cap layer, performing a SEG process to form epitaxial silicon layers in each recess, performing a source/drain formation process to form a first type source/drain area in the substrate at two sides of the first type gate structure and a second type source/drain area in the substrate at two sides of the second type gate structure, and performing an etching back process to etch back and thin down the patterned cap layer and the hard mask layer covering the first type gate structure.

According to the claimed invention, still another method for manufacturing CMOS transistors is provided. The method comprises steps of providing a substrate comprising at least a first type gate structure and a second type gate structure, each of the gate structures comprises a gate dielectric layer, a gate conductive layer, and a hard mask layer. Next, performing an etching back process to etch back and thin down the hard mask layer covering the first type gate structure. Then, forming first type LDDs and a first type source/drain area in the substrate at two sides of the first type gate structure, and second type LDDs and a second type source/drain area in the substrate at two sides of the second type gate structure, performing an etching process to form recesses in the substrate respectively at two sides of the second type gate structure through a patterned cap layer, and performing a SEG process to form epitaxial silicon layers in each recess.

According to the method for manufacturing CMOS transistors provided by the present invention, an etching back process is alternatively performed after the gate structure formation, the LDD formation, the source/drain implantation, or the SEG process to etch the hard mask layer covering the first type gate structure for reducing thickness deviation between the hard mask layers covering the first type gate structure and the second type gate structure. Therefore the damage to the spacers, the STIs, and the profile of the gate structures due to the thickness deviation is prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
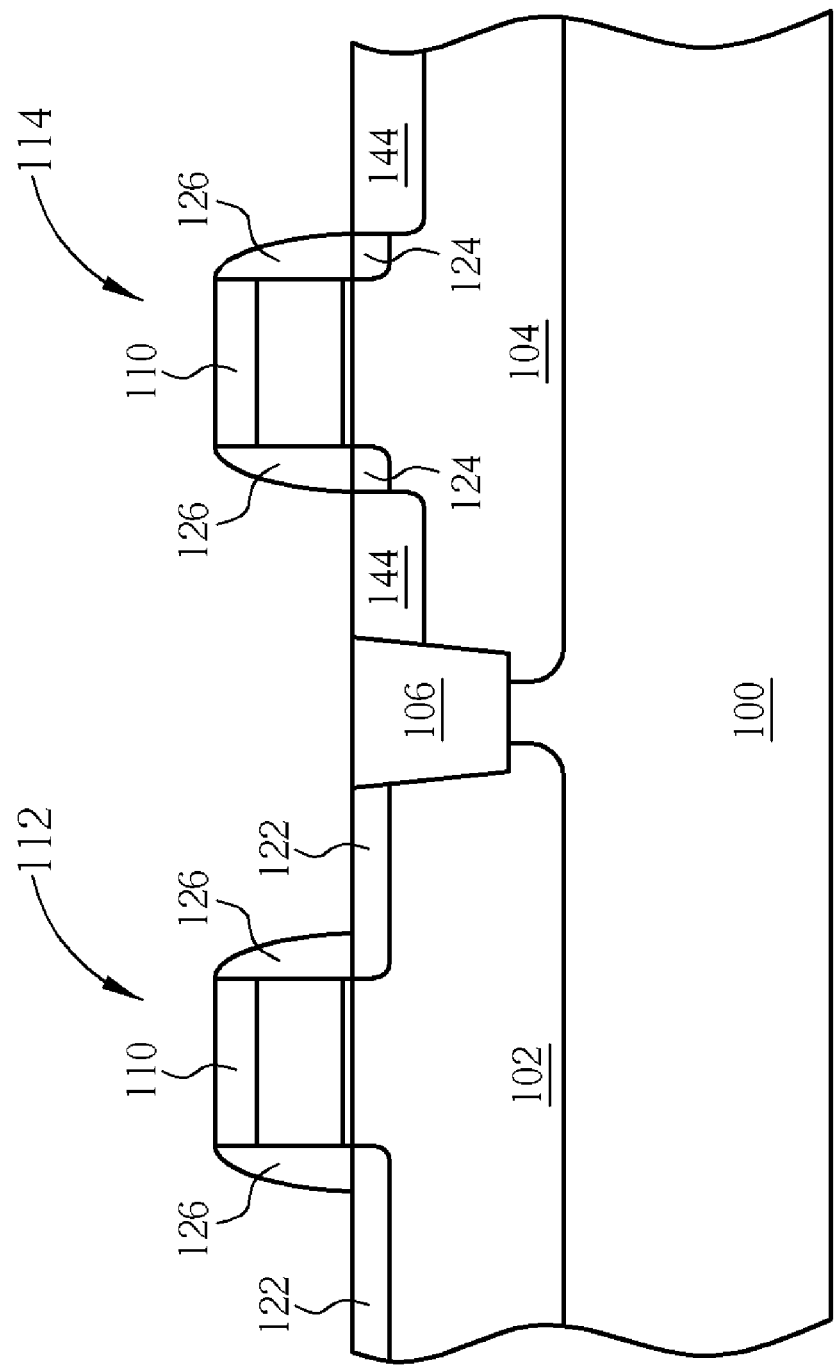
FIGS. 1-4 are schematic drawings illustrating a conventional method for manufacturing CMOS transistors.
Figure 2:
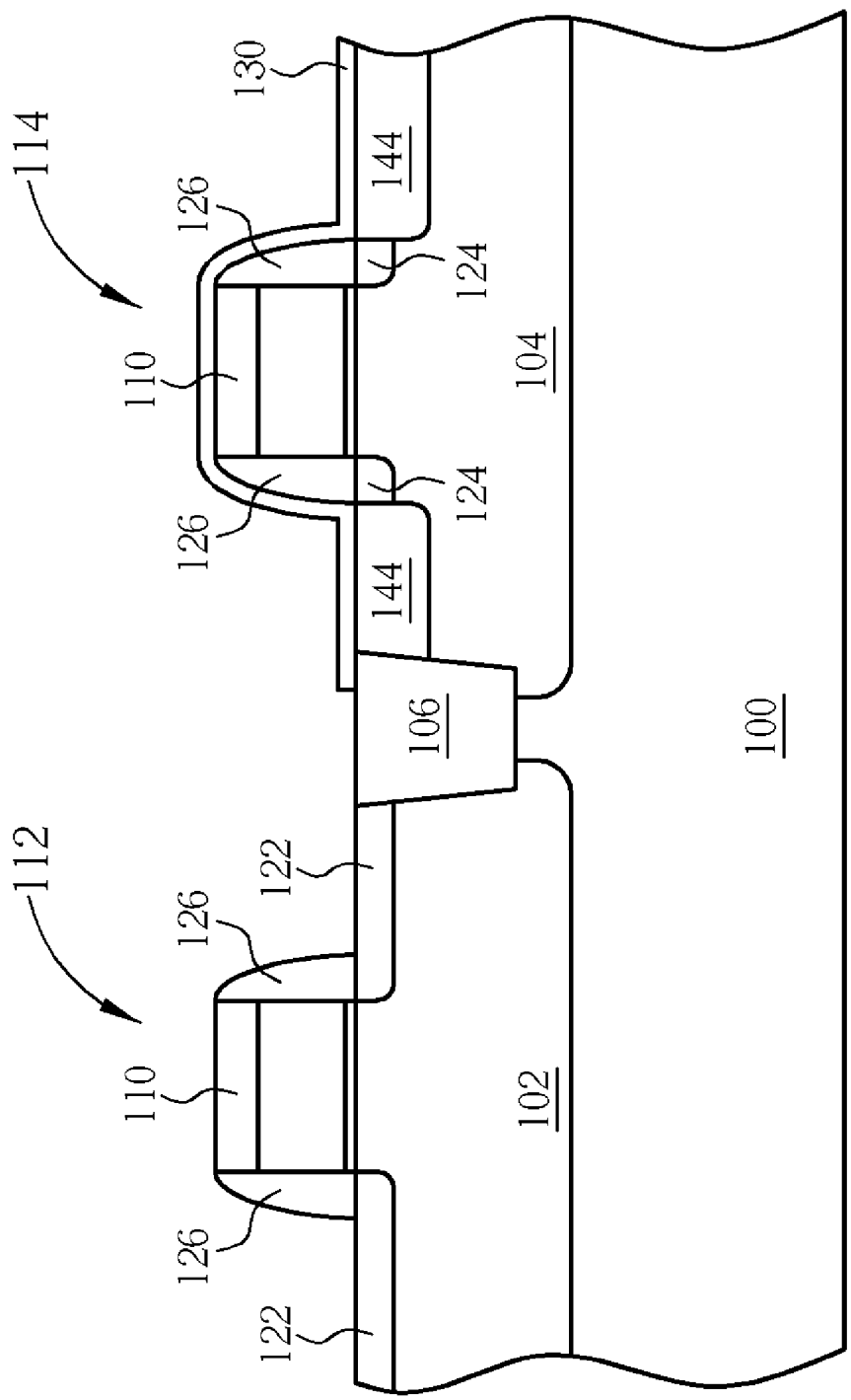
Figure 3:
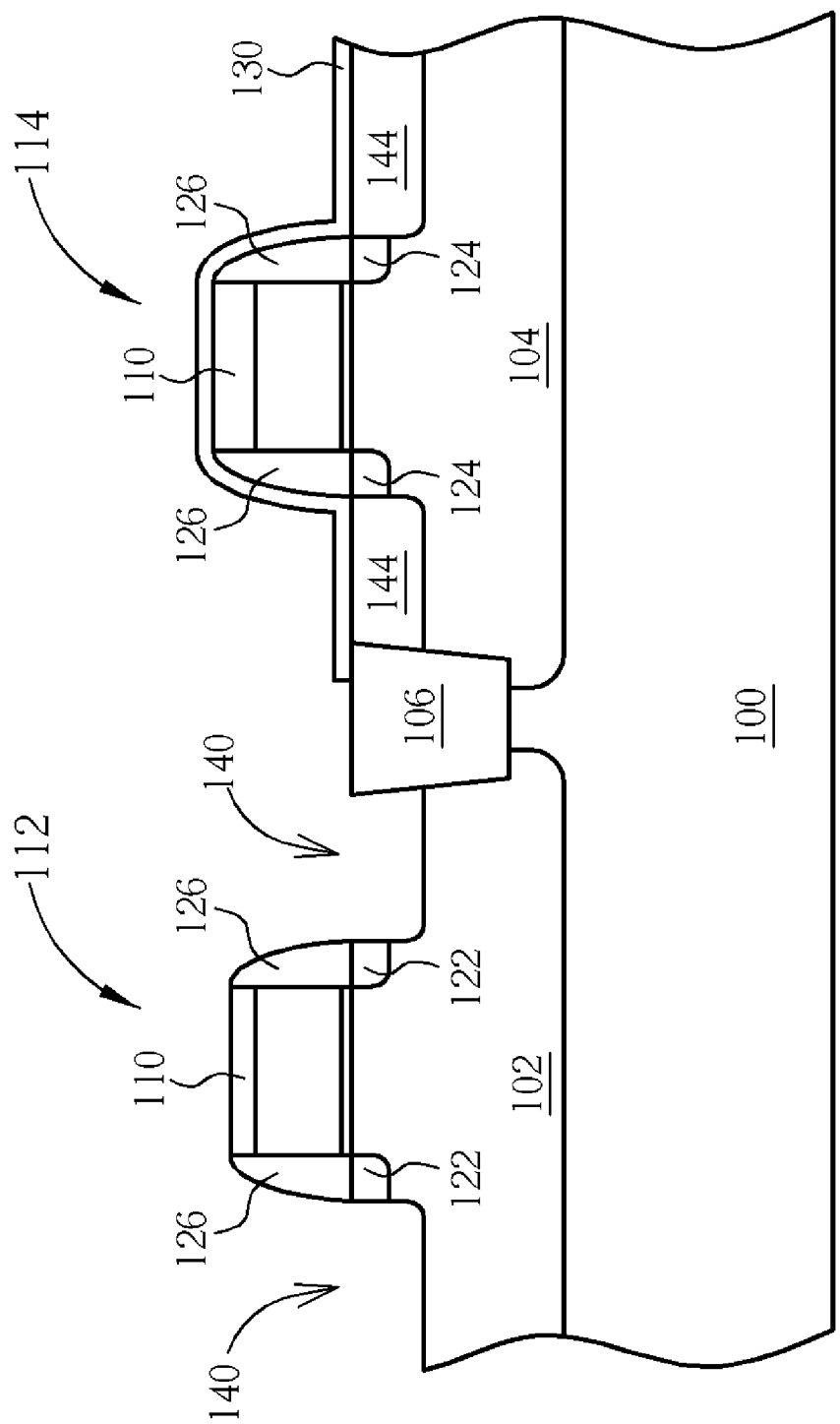
Figure 4:
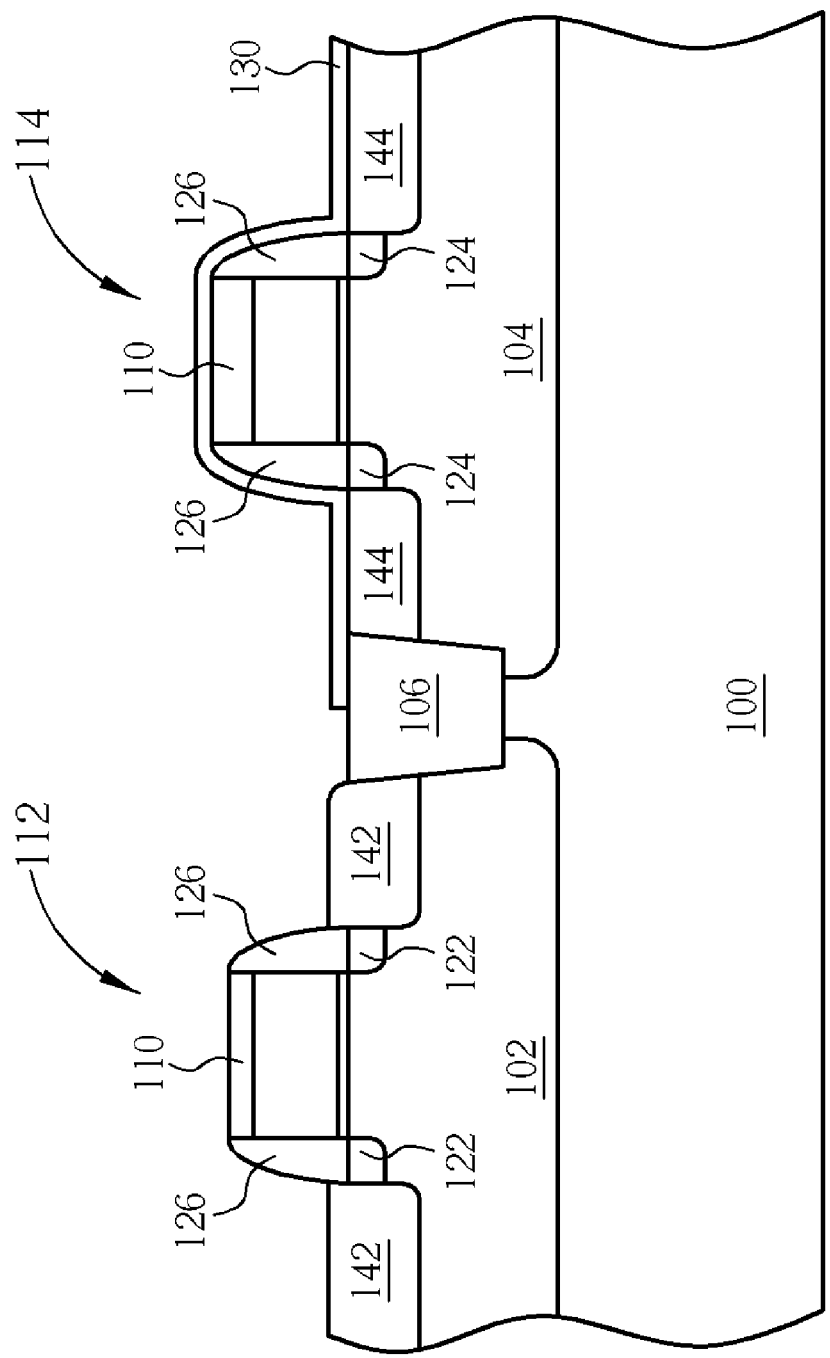
Figure 5:
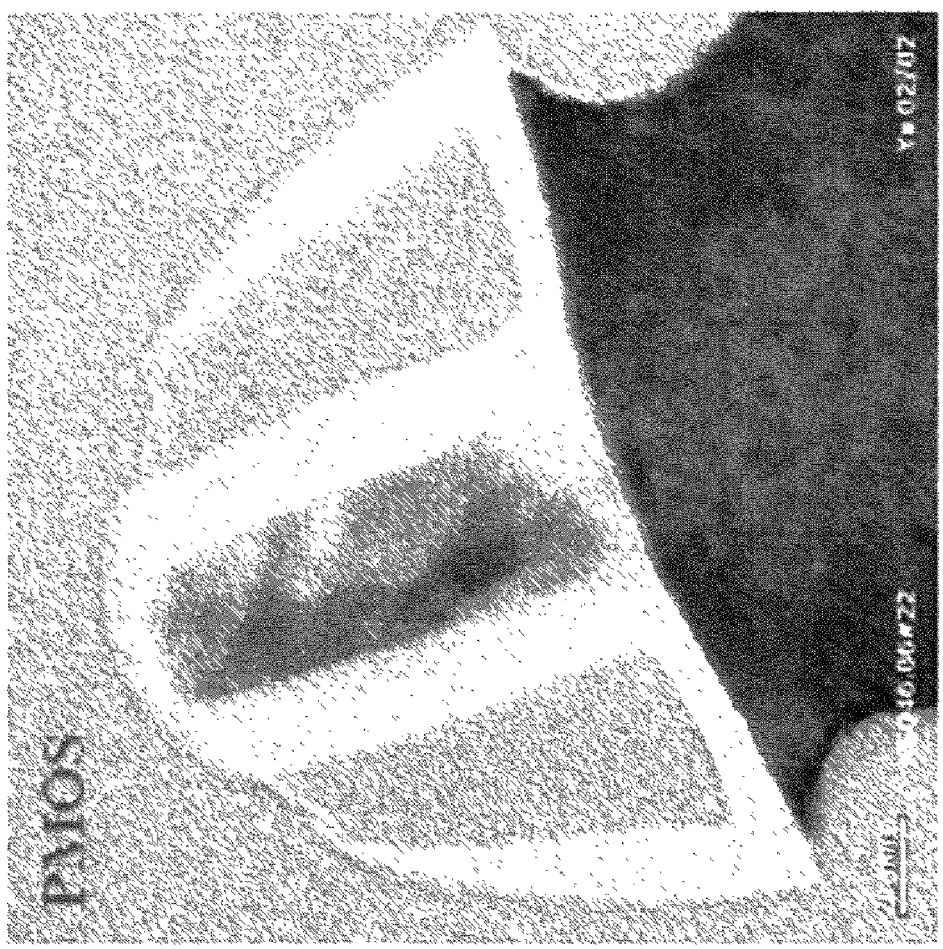
FIGS. 5-6 are SEM pictures of a PMOS and an NMOS respectively.
Figure 6:
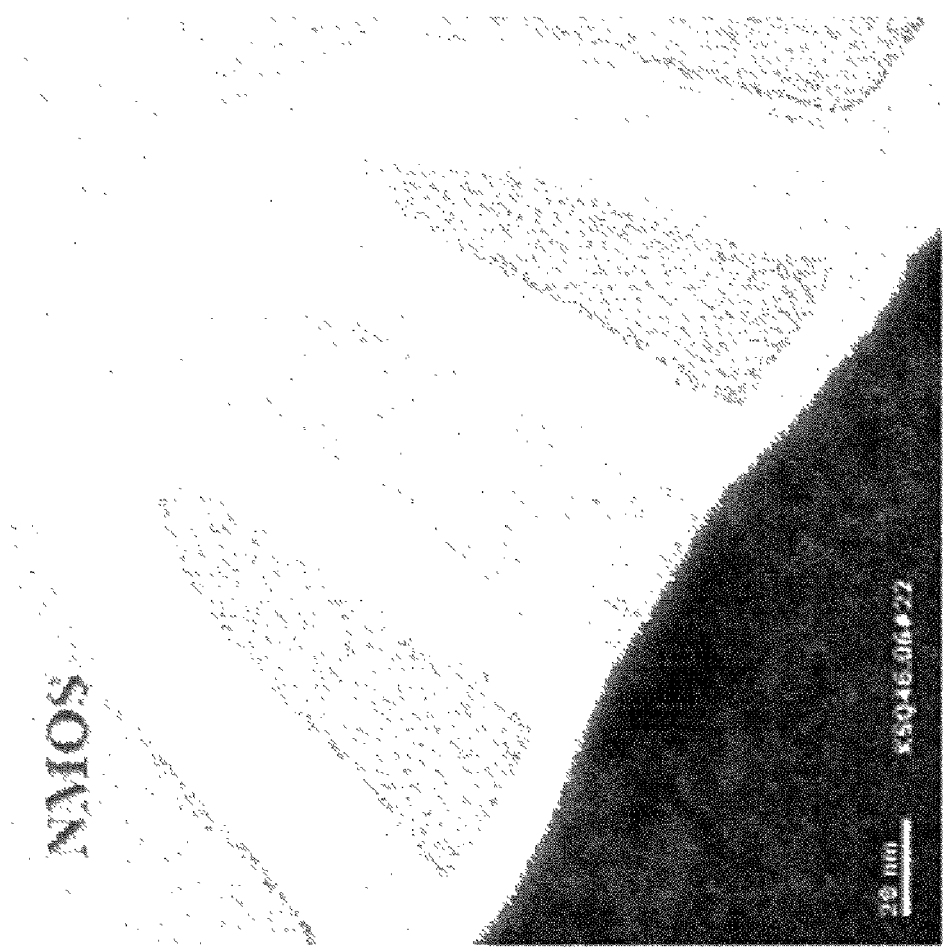
Figure 7:
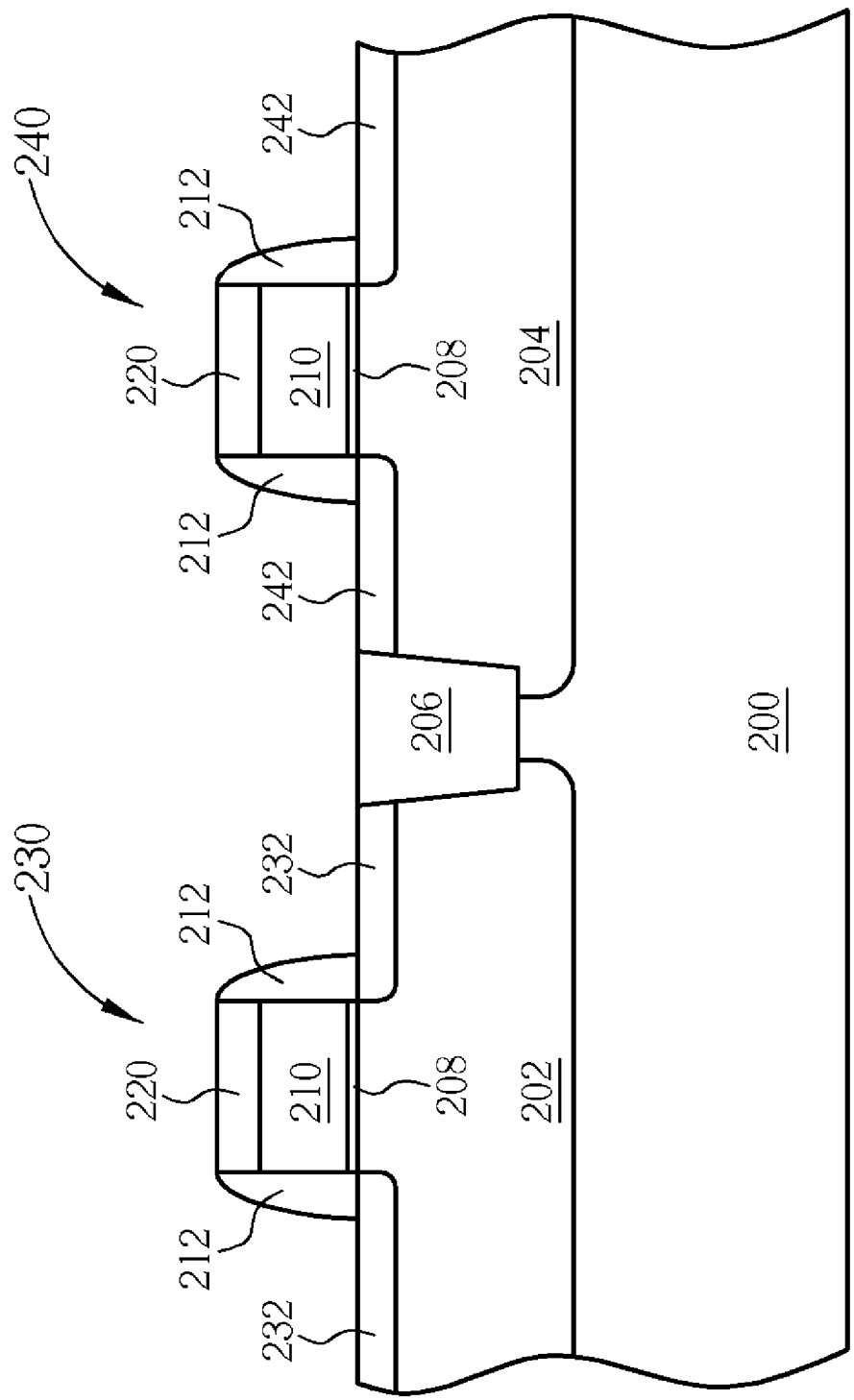
FIGS. 7-12 are schematic drawings illustrating a method for manufacturing CMOS transistors according to a first preferred embodiment.

Please refer to FIGS. 7-12, which are schematic drawings illustrating a method for manufacturing CMOS transistors according to a first preferred embodiment. As shown in FIG. 7, a substrate 200 comprising a first active area such as a first type well 202, a second active area such as a second type well 204, and a shallow trench isolation (STI) 206 formed in between is firstly provided. Forming a first type gate structure 230 and a second type gate structure 240 respectively in the first type well 202 and the second type well 204. Each gate structure 230 and 240 comprises a gate dielectric layer 208, a gate conductive layer 210, and a hard mask layer 220 comprising silicon oxide ($SiO_2$), silicon nitride (SiN), silicon oxynitride (SiON), silicon carbon nitride (SiCN), silicon carbide (SiC), silicon oxycarbide (SiOC), or silicon-rich-nitride (SRN). The hard mask layer 220 used to define a position of the gate conductive layer 210 and to protect the gate conductive layer 210 in following etching and cleaning processes is deposited on the gate conductive layer 210 by a chemical vapor deposition (CVD) process such as a plasma-enhanced chemical vapor deposition (PECVD) process, a sib-atmosphere chemical vapor deposition (SACVD) process, or a low pressure chemical vapor deposition (LPCVD) process. The hard mask layer 220 has a thickness of about 400-600 angstroms.

Please refer to FIG. 7 again. Conventional lightly doped drain (LDD) implantation processes are performed to form first type LDDs 232 in the substrate 200 respectively at two sides of the first type gate structure 230 and to form second type LDDs 242 in the substrate 200 respectively at two sides of the second type gate structure 240. Then, spacers 212 are formed on sidewalls of each gate structure 230 and 240, respectively.

Figure 8:
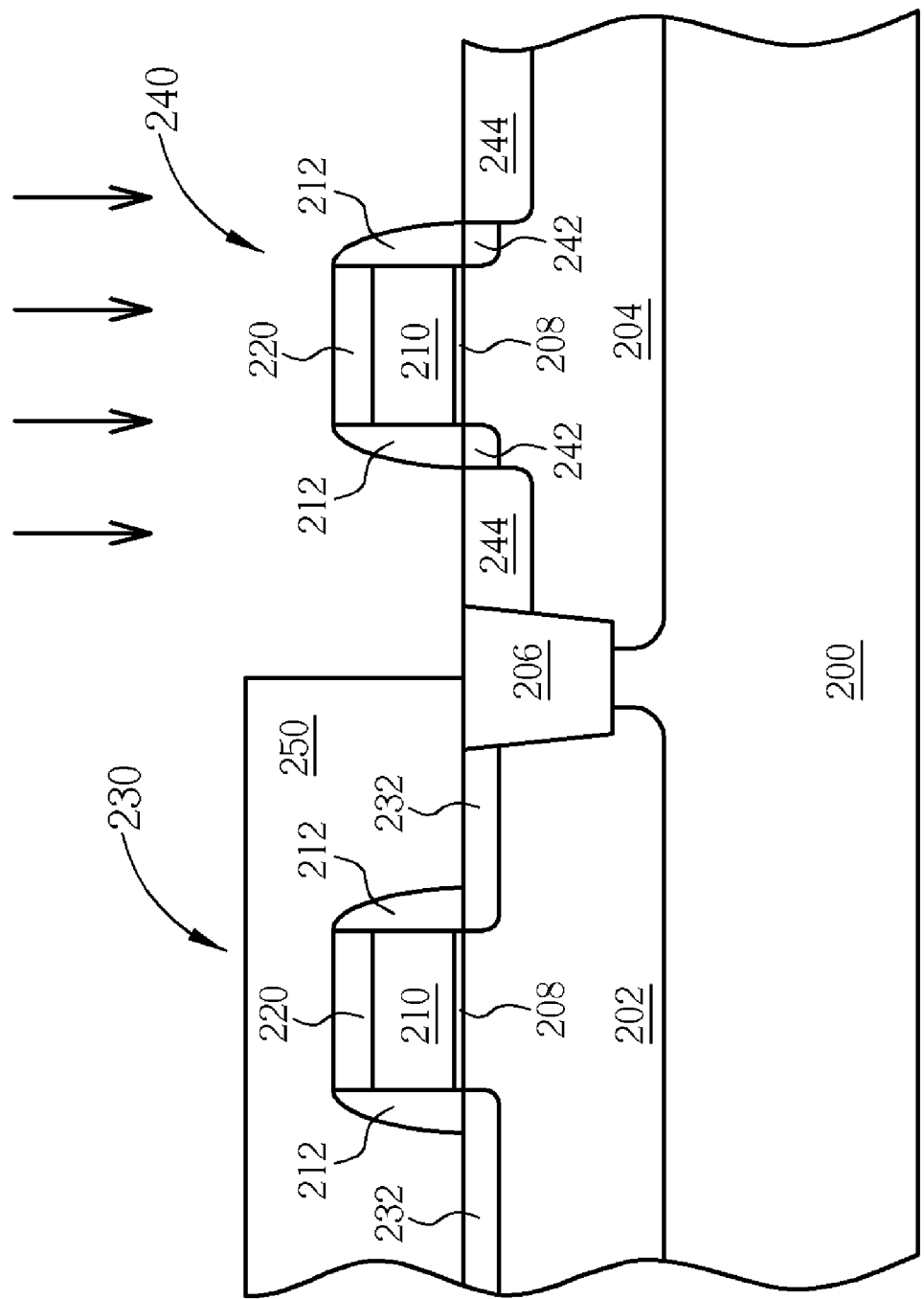
Figure 9:
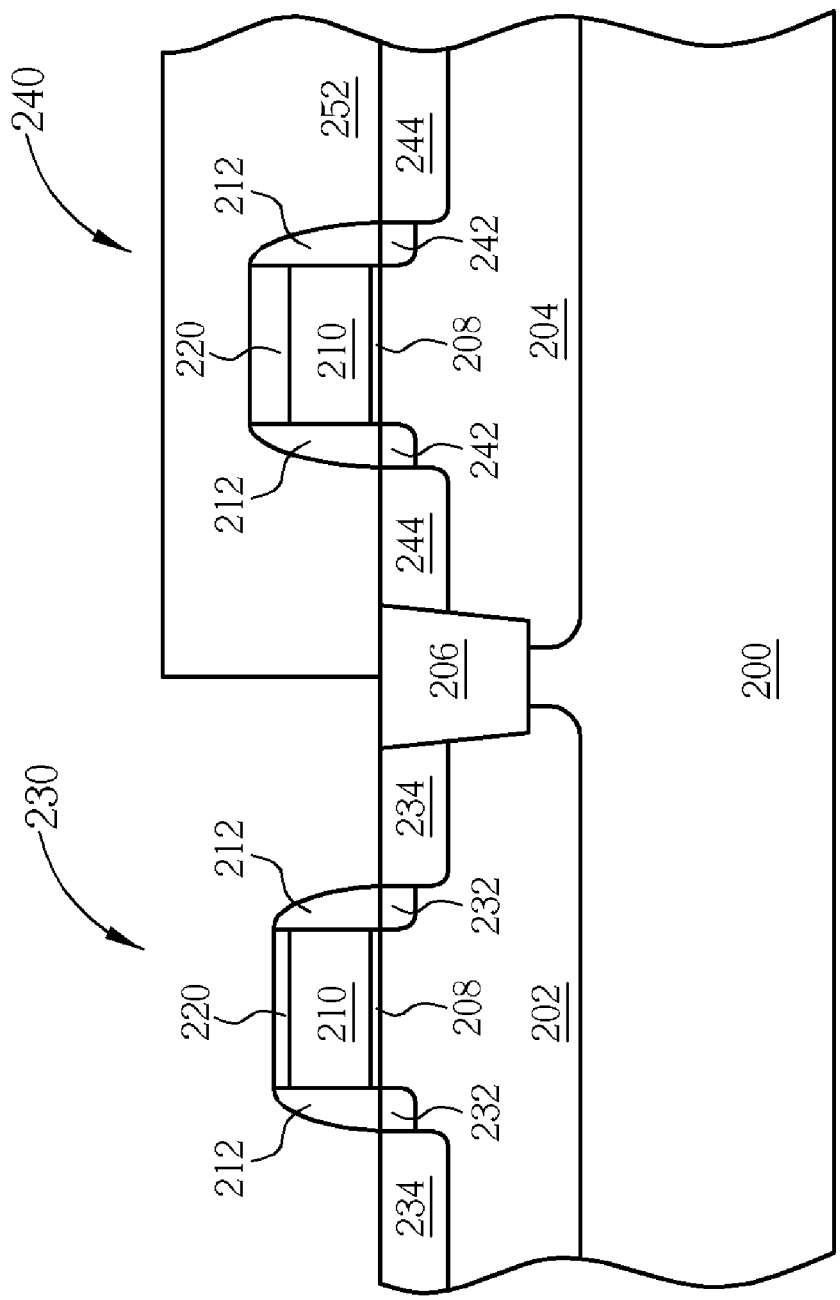

Please refer to FIGS. 8-9. Next, a source/drain formation process is performed. As shown in FIG. 8, a patterned first photoresist 250 exposing the second type well 204 is formed on the substrate 200. Performing a first ion implantation step to form a second type source/drain area 244 in the substrate 200 at two sides of the second type gate structure 240 through the patterned first photoresist 250. As shown in FIG. 9, after removing the patterned first photoresist 250, a patterned second photoresist 252 exposing the first type well 202 is formed on the substrate 200. Performing a second ion implantation step to form a first type source/drain area 234 in the substrate 200 at two sides of the first type gate structure 230 through the patterned second photoresist 252. It is noteworthy that the patterned photoresist 252 is used as an etching mask in an etching back process performed before the second ion implantation step. The etching back process is used to thin down the hard mask layer 220 covering the first type gate structure 230. The etch back process can alternatively be performed after the second ion implantation step which amorphizes the hard mask layer 220 and makes the hard mask layer 220 obtain a higher wet etching ratio. After removing the patterned second photoresist 252, a wet cleaning step comprising a dilute HF (DHF) is performed to remove any remaining photoresist. The hard mask layer 220 is thinned in a range of 0-400 angstroms in the etching back process. The etching back process comprises a wet etching process utilizing DHF or a dry etching process such as a reactive ion etching (RIE), an ion beam etching, a plasma etching, or a laser ablation.

Figure 10:
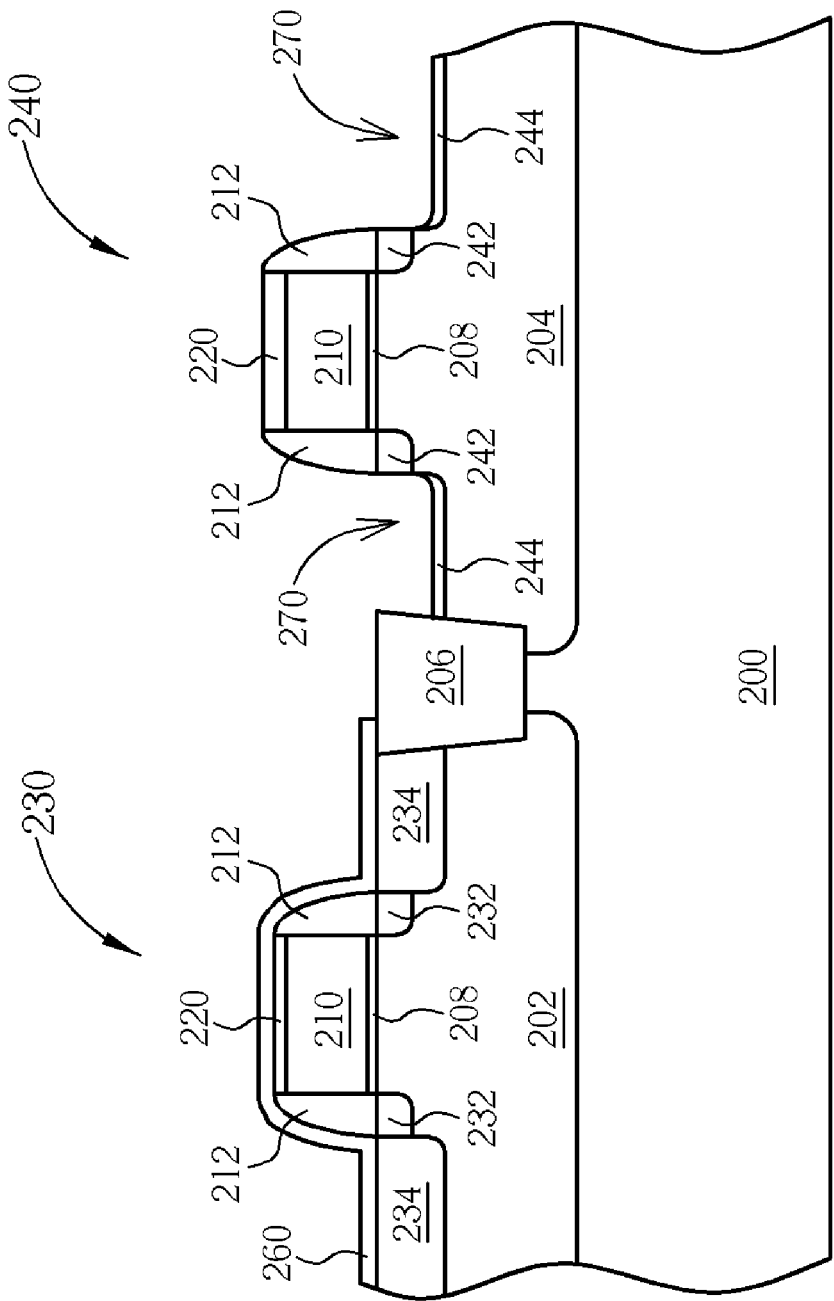

Please refer to FIG. 10. A patterned cap layer 260 having a thickness of about 150-250 angstroms and exposing the second type well 204 is formed on the substrate 200. The patterned cap layer 260 comprises silicon oxide with silane ($SiH_4$), tetra-ethyl-ortho-silicate (TEOS), tetra-methyl silane (4MS), tetra-methyl cyclo tetra-siloxane (TMCTS), diethoxy-methyl-silane (DEMS) or other silicon-containing chemicals used as precursor and with $CO_2$, $N_2O$, $O_2$, or $O_3$ used as oxidizing agent. In addition, He, Ar, $N_2$, $NH_3$, $CO_2$, or $O_2$ can be used in a pre-treatment or a post-treatment. Please refer to FIG. 10 again. An etching process is performed to form recesses 270 in the substrate 200 respectively at two sides of the second type gate structure 240.

Figure 11:
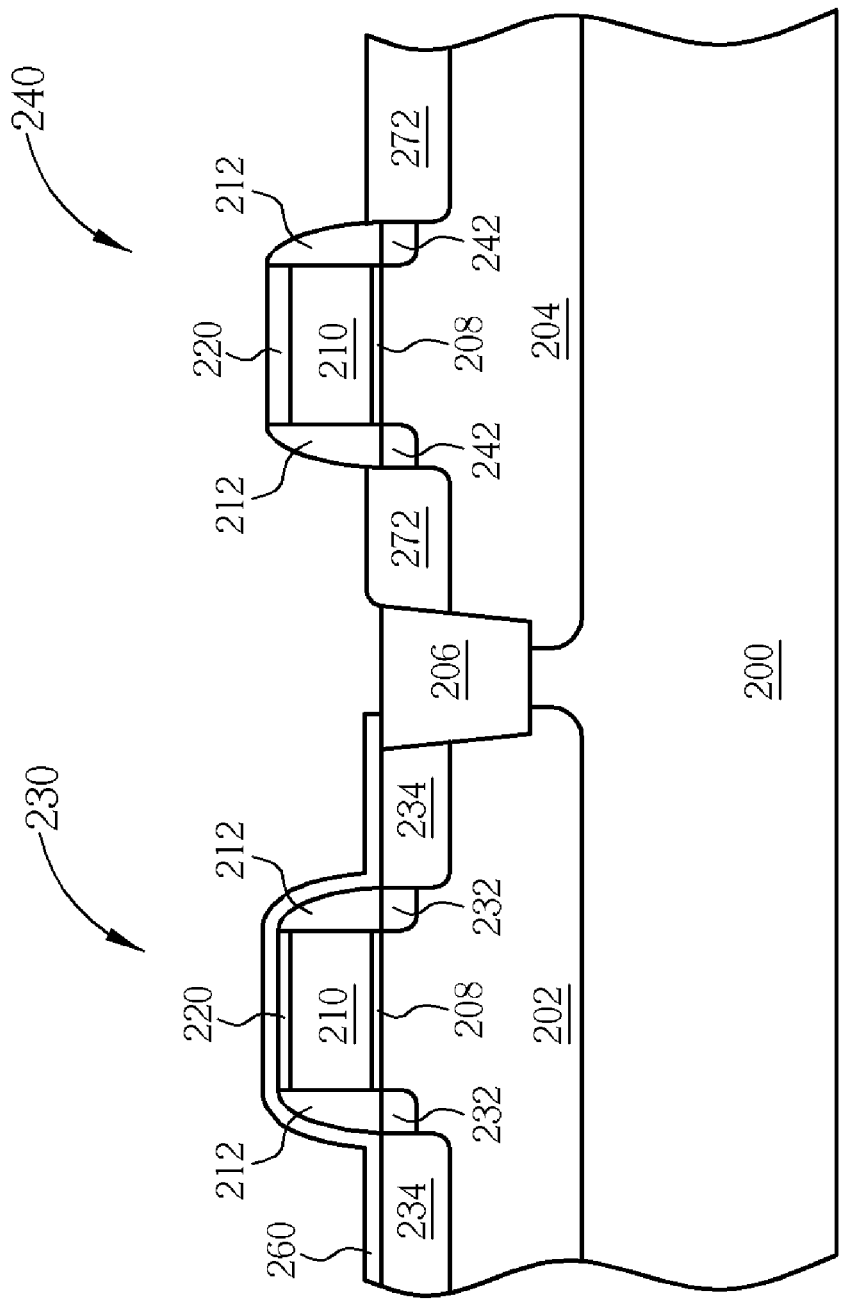
Figure 12:
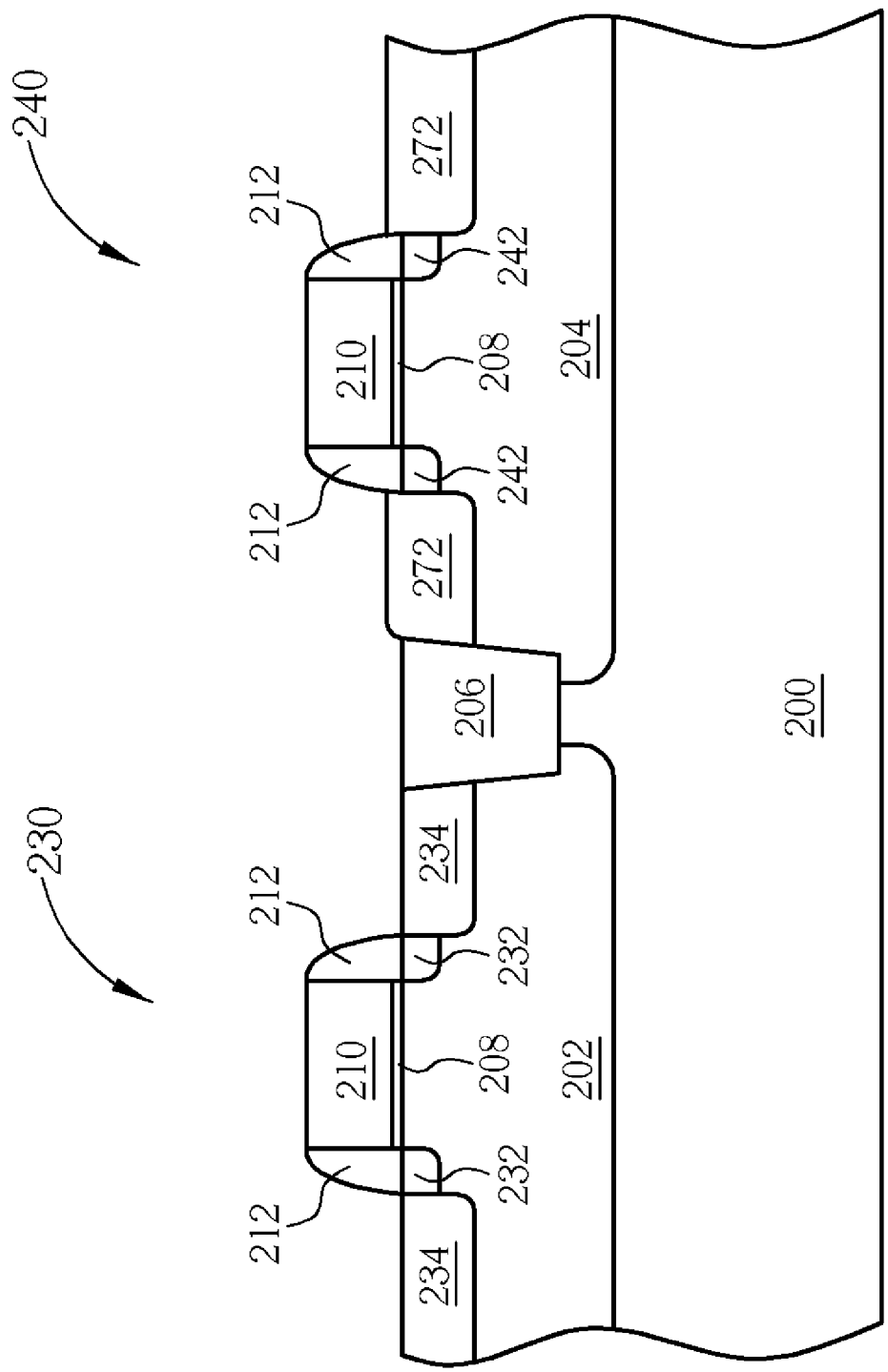

Please refer to FIGS. 11-12. Then, a selective epitaxial growth (SEG) process is performed to form epitaxial silicon layers 272 respectively in each recess 270. And as shown in FIG. 12, the patterned cap layer 260 and the hard mask layers 220 are removed for following process such as a silicide process.

Please refer to FIG. 11 again. Please note that consumption of the hard mask layer 220 covering the second type gate structure 240 occurs not only in the recess 270 etching, but also in a cleaning step after forming the recess 270 and a cleaning step before SEG process. Therefore a thickness deviation between the hard mask layers 220 covering the first type gate structure 230 and the second type gate structure 240 is obtained in the prior art. However, since the hard mask layer 220 covering the first type gate structure 230 is thinned in the etching back process, such thickness deviation is reduced according to the first preferred embodiment. When the hard mask layers 220 and the patterned cap layer 260 are completely removed for following processes, liner oxide of the spacers 212, the STI 206, and profile of the second type gate structure 240 will not be damaged for removing the thicker hard mask layer 220. Therefore peeling of the spacer 212 is prevented. Damages to the STI 206 which lead to silicide layer formed under the STI 206 and cause current leakage is also avoided.

In the first preferred embodiment, when the first type well 202 is a P-type well and the second type well 204 is an N-type well, the first type LDDs 232 are N-type LDDs and the second type LDDs 242 are P-type LDDs, the first type source/drain area 234 is an N-type source/drain area and the second type source/drain area 244 is a P-type source/drain area, and the epitaxial layer 272 comprises silicon germanium (SiGe). When the first type well 202 is an N-type well and the second type well 204 is a P-type well, the first type LDDs 232 are P-type LDDs and the second type LDDs 242 are N-type LDDs, the first type source/drain area 234 is an P-type source/drain area and the second type source/drain area 244 is a N-type source/drain area, and the epitaxial layer 272 comprises silicon carbide (SiC).

Figure 13:
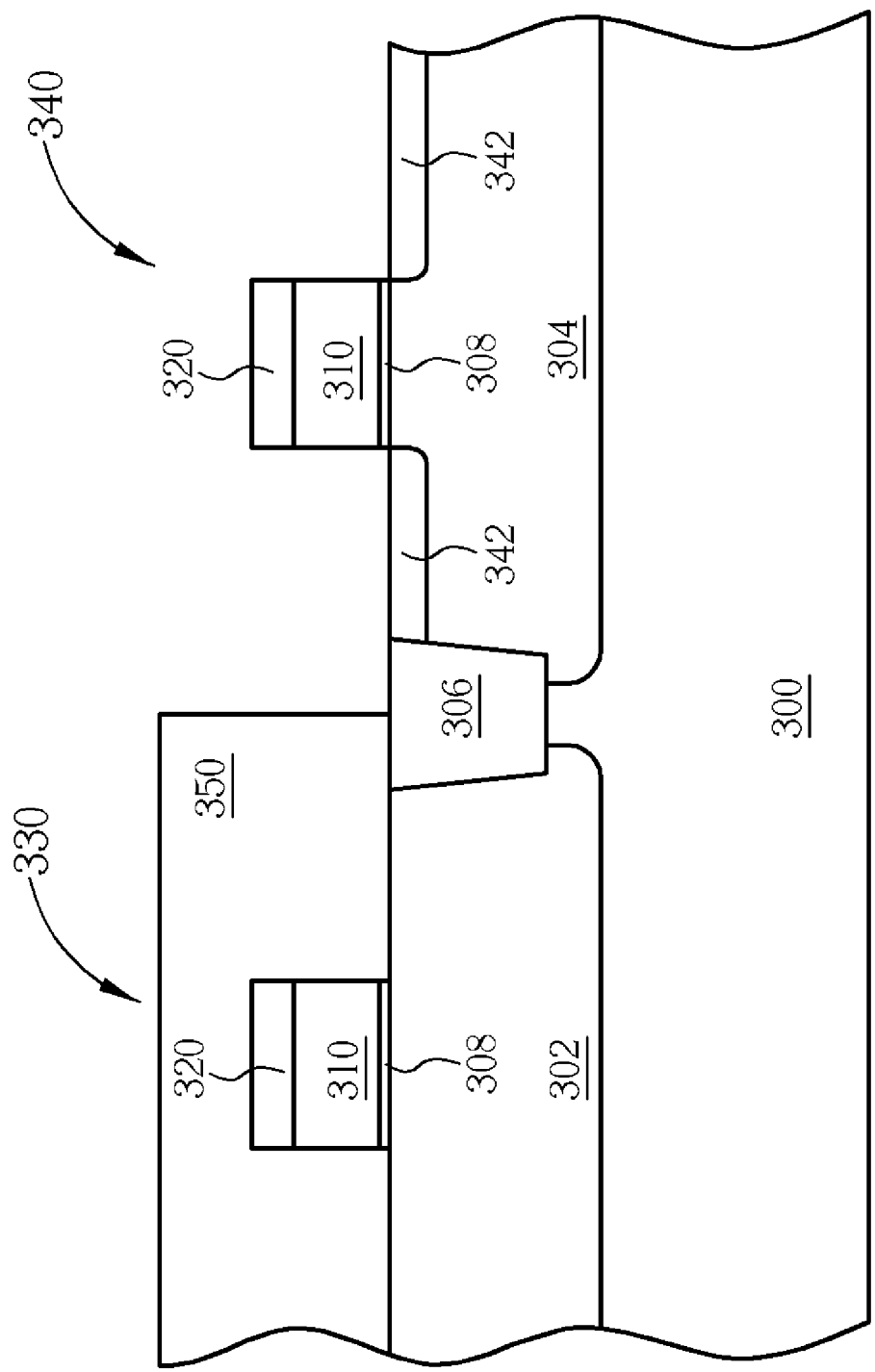
FIGS. 13-15 are schematic drawings illustrating a method for manufacturing CMOS transistors according to a second preferred embodiment.
Figure 14:
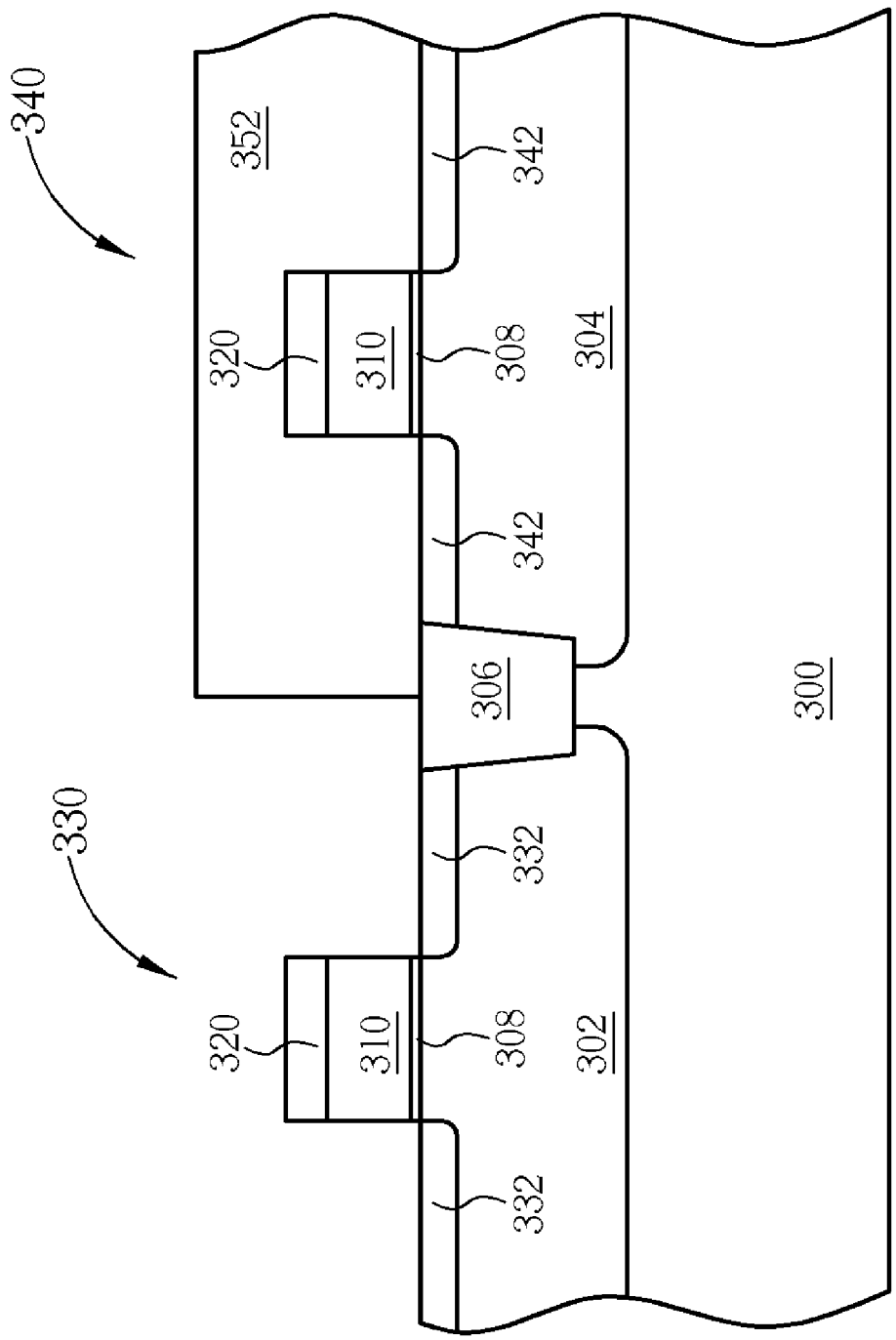
Figure 15:
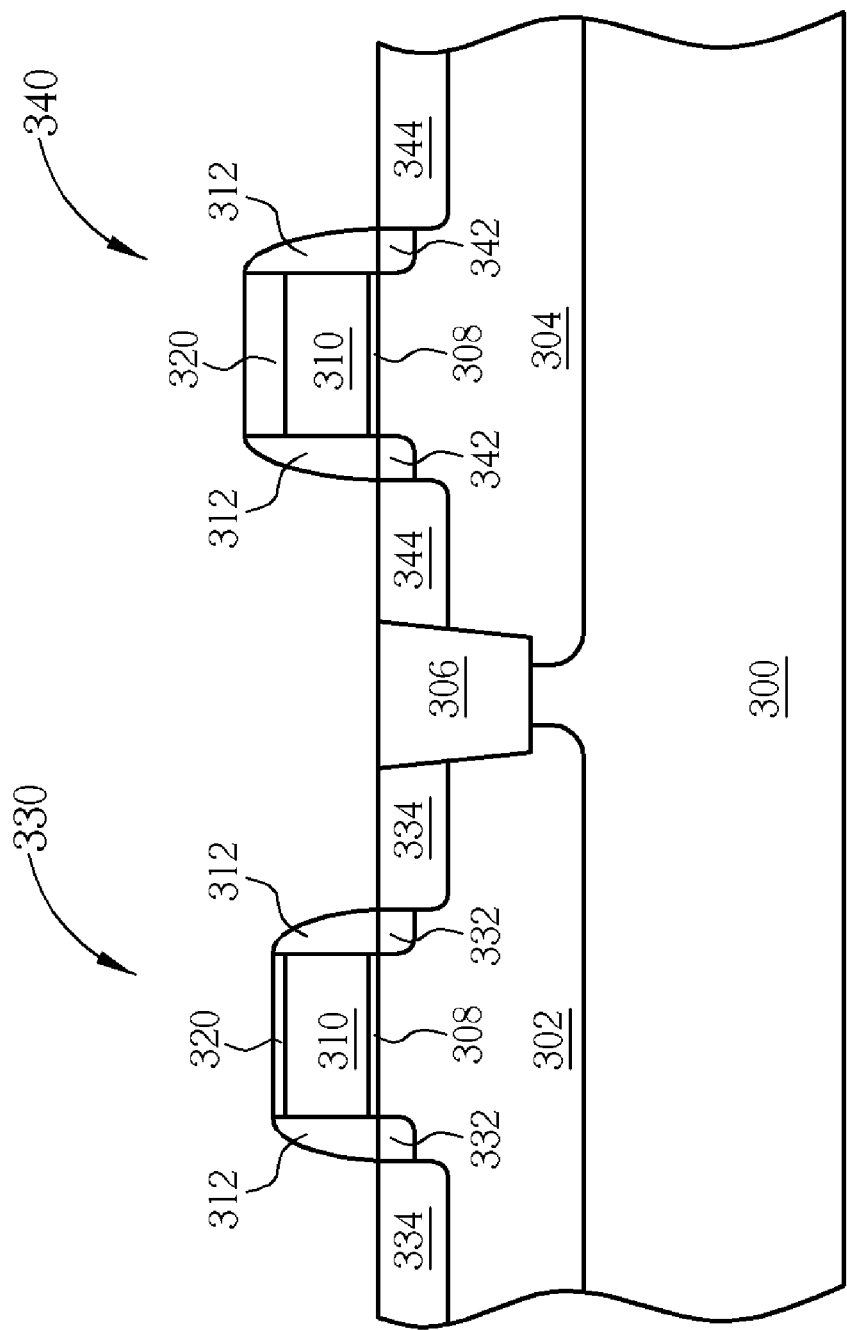

Please refer to FIGS. 13-15, which are schematic drawings illustrating a method for manufacturing CMOS transistors according to a second preferred embodiment. As shown in FIG. 13, a substrate 300 comprises a first active area such as a first type well 302, a second active area such as a second type well 304, and a STI 306 formed in between is firstly provided. A first type gate structure 330 and a second type gate structure 340 are formed respectively in the first type well 302 and the second type well 304. Each gate structure 330 and 340 comprises a gate dielectric layer 308, a gate conductive layer 310, and a hard mask layer 320 comprising $SiO_2$, SiN, SiON, SiCN, SiC, SiOC, or SRN. The hard mask layer 320 used to define a position of the gate conductive layer 310 and to protect the gate conductive layer 310 in following processes is deposited on the gate conductive layer 310 by a CVD process such as a PECVD process, a SACVD process, or a LPCVD process. The hard mask layer 220 has a thickness of about 400-600 angstroms.

Please refer to FIGS. 13-14. Then a LDD implantation process is performed. First, a patterned first photoresist 350 exposing the second type well 204 is formed on the substrate 300. Performing a first ion implantation step to form second type LDDs 342 in the substrate 300 at two sides of the second type gate structure 340 through the patterned first photoresist 350. As shown in FIG. 14, after removing the patterned first photoresist 350, a patterned second photoresist 352 exposing the first type well 302 is formed on the substrate 300. A second ion implantation step is performed to form first type LDDs at two sides of the first type gate structure 330 through the patterned second photoresist 352. It is noteworthy that the patterned photoresist 352 is used as a mask in an etching back process performed before the second ion implantation step. The etching back process is used to thin down the hard mask layer 320 covering the first type gate structure 330. The etching back process can alternatively be performed after the second ion implantation step which amorphizes the hard mask layer 320 and makes the hard mask layer 320 obtain a higher wet etching ratio. After removing the patterned second photoresist 352, a wet cleaning step comprising a DHF is performed to remove any remaining photoresist. The hard mask layer 320 is thinned in a range of 0-400 angstroms in the etching back process. The etching back process comprises a wet etching process utilizing a DHF or a dry etching process such as a RIE, an ion beam etching, a plasma etching, or a laser ablation.

Please refer to FIG. 15. Then, spacers 312 are formed on sidewalls of each gate structure 330 and 340, respectively. And conventional source/drain formation processes are performed to form a first type source/drain area 334 in the substrate 300 respectively at two sides of the first type gate structure 330 and to form a second type source/drain area 344 in the substrate 300 respectively at two sides of the second type gate structure 340. Next, a patterned cap layer having a thickness of about 150-250 angstroms is formed on the first type well 302, performing an etching process to form recesses in the substrate 300 respectively at two sides of the second type gate structure 340, performing a SEG process to form epitaxial silicon layers in each recess, and removing the patterned cap layer and the hard mask layers 320. And a salicide process can be performed according to the process requirement. Because the processes are the same with the first preferred embodiment, further description of the process is omitted in the interest of brevity.

Additionally, in the second preferred embodiment, when the first type well 302 is a P-type well and the second type well 304 is an N-type well, the first type LDDs 332 are N-type LDDs and the second type LDDs 342 are P-type LDDs, the first type source/drain area 334 is an N-type source/drain area and the second type source/drain area 344 is a P-type source/drain area, and the epitaxial layer comprises SiGe. When the first type well 302 is an N-type well and the second type well 304 is a P-type well, the first type LDDs 332 are P-type LDDs and the second type LDDs 342 are N-type LDDs, the first type source/drain area 334 is an P-type source/drain area and the second type source/drain area 344 is a N-type source/drain area, and the epitaxial layer comprises SiC.

As mentioned above, consumption of the hard mask layer 320 covering the second type gate structure 340 occurs not only in the recess etching, but also in a cleaning step after forming the recess and a cleaning step before SEG process. Therefore a thickness deviation between the hard mask layers 320 covering the first type gate structure 330 and the second type gate structure 340 is obtained in the prior art. However, since the hard mask layer 320 covering the first type gate structure 330 is thinned in the etching back process, such thickness deviation is reduced according to the second preferred embodiment. When the hard mask layers 320 and the patterned cap layer are removed for following processes, liner oxide of the spacers 312, the STI 306, and profile of the second type gate structure 340 will not be damaged for removing the thicker hard mask layer 320. Therefore peeling of the spacer 312 is prevented. And damages to the STI 306 which lead to silicide layer formed under the STI 306 and cause current leakage is also avoided.

Figure 16:
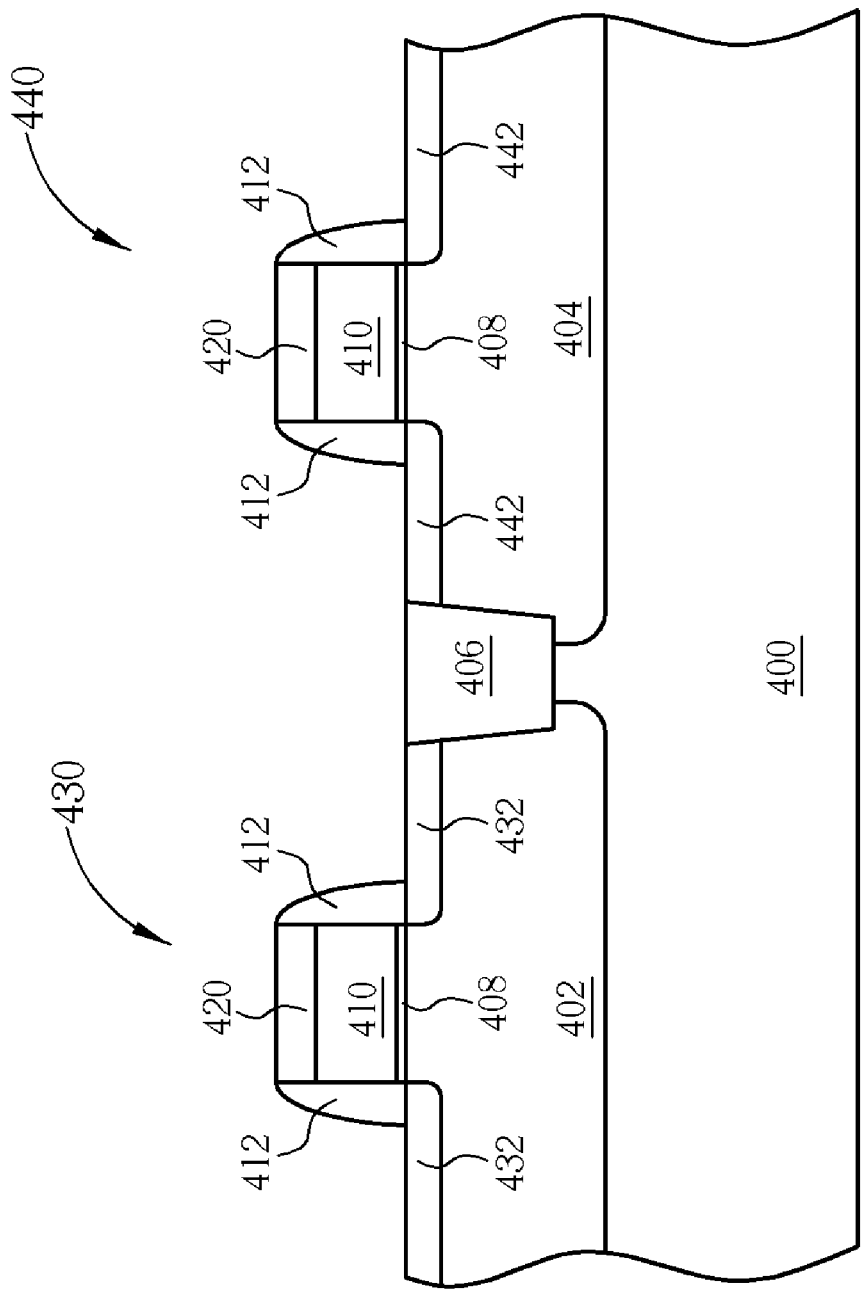
FIGS. 16-21 are schematic drawings illustrating a method for manufacturing CMOS transistors according to a third preferred embodiment.

Please refer to FIGS. 16-21, which are schematic drawings illustrating a method for manufacturing CMOS transistors according to a third preferred embodiment. As shown in FIG. 16, a substrate 400 comprises a first active area such as a first type well 402, a second active area such as a second type well 404, and a STI 406 formed in between is firstly provided. A first type gate structure 430 and a second type gate structure 440 are formed respectively in the first type well 402 and the second type well 404. Each gate structure 430 and 440 comprises a gate dielectric layer 408, a gate conductive layer 410, and a hard mask layer 420 comprising $SiO_2$, SiN, SiON, SiCN, SiC, SiOC, or SRN. The hard mask layer 420 used to define a position of the gate conductive layer 410 and to protect the gate conductive layer 410 in following processes is deposited on the gate conductive layer 410 by a CVD process such as a PECVD process, a SACVD process, or a LPCVD process. The hard mask layer 420 has a thickness of about 400-600 angstroms.

Please refer to FIG. 16 again. Then, conventional LDD implantation processes are performed to form first type LDDs 432 in the substrate 400 respectively at two sides of the first type gate structure 430 and to form second type LDDs 442 in the substrate 400 respectively at two sides of the second type gate structure 440. Then, spacers 412 are formed on sidewalls of each gate structure 430 and 440, respectively.

Figure 17:
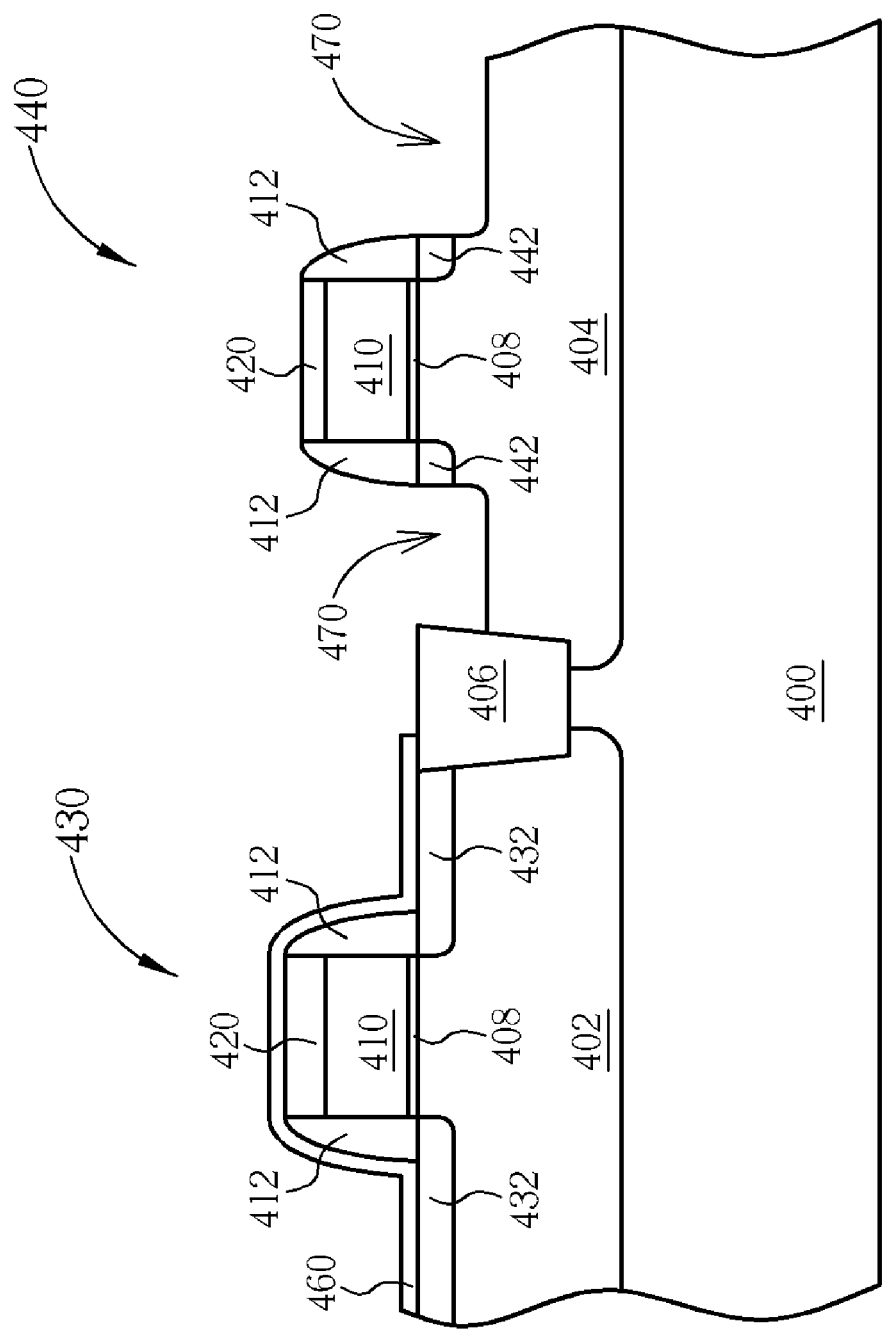

Please refer to FIG. 17. A patterned cap layer 460 having a thickness of about 150-250 angstroms and exposing the second type well 404 is formed on the substrate 400. The patterned cap layer 460 comprises silicon oxide with silane, TEOS, 4MS, TMCTS, DEMS or other silicon-containing chemicals used as precursor and with $CO_2$, $N_2O$, $O_2$, or $O_3$ used as oxidizing agent. In addition, He, Ar, $N_2$, $NH_3$, $CO_2$, or $O_2$ can be used in a pre-treatment or a post-treatment. Next, an etching process is performed to form recesses 470 in the substrate 400 respectively at two sides of the second type gate structure 440 with the patterned cap layer 460, the hard mask layer 420, the spacer 412, and the STI 406 as an etching mask.

Figure 18:
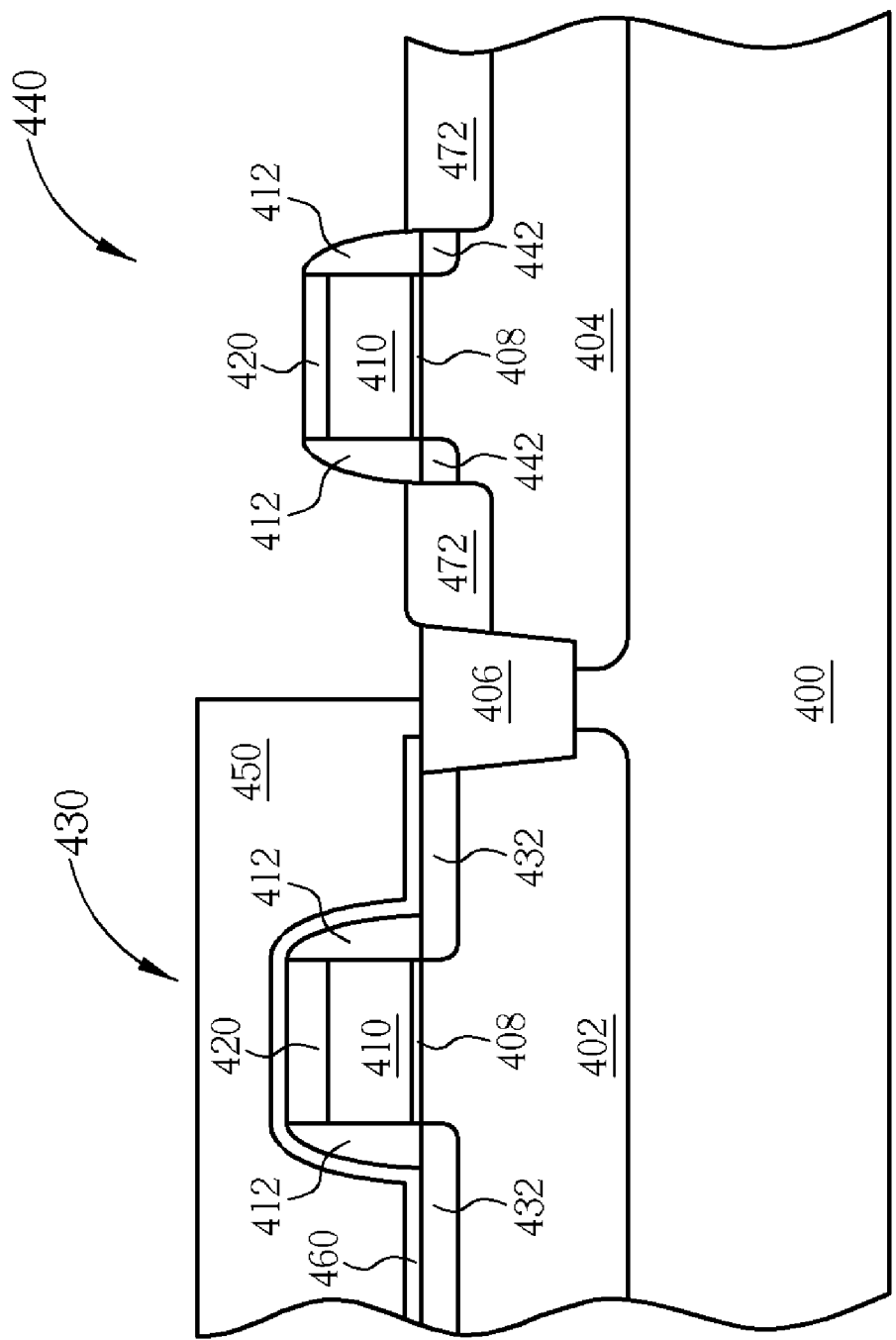
Figure 19:
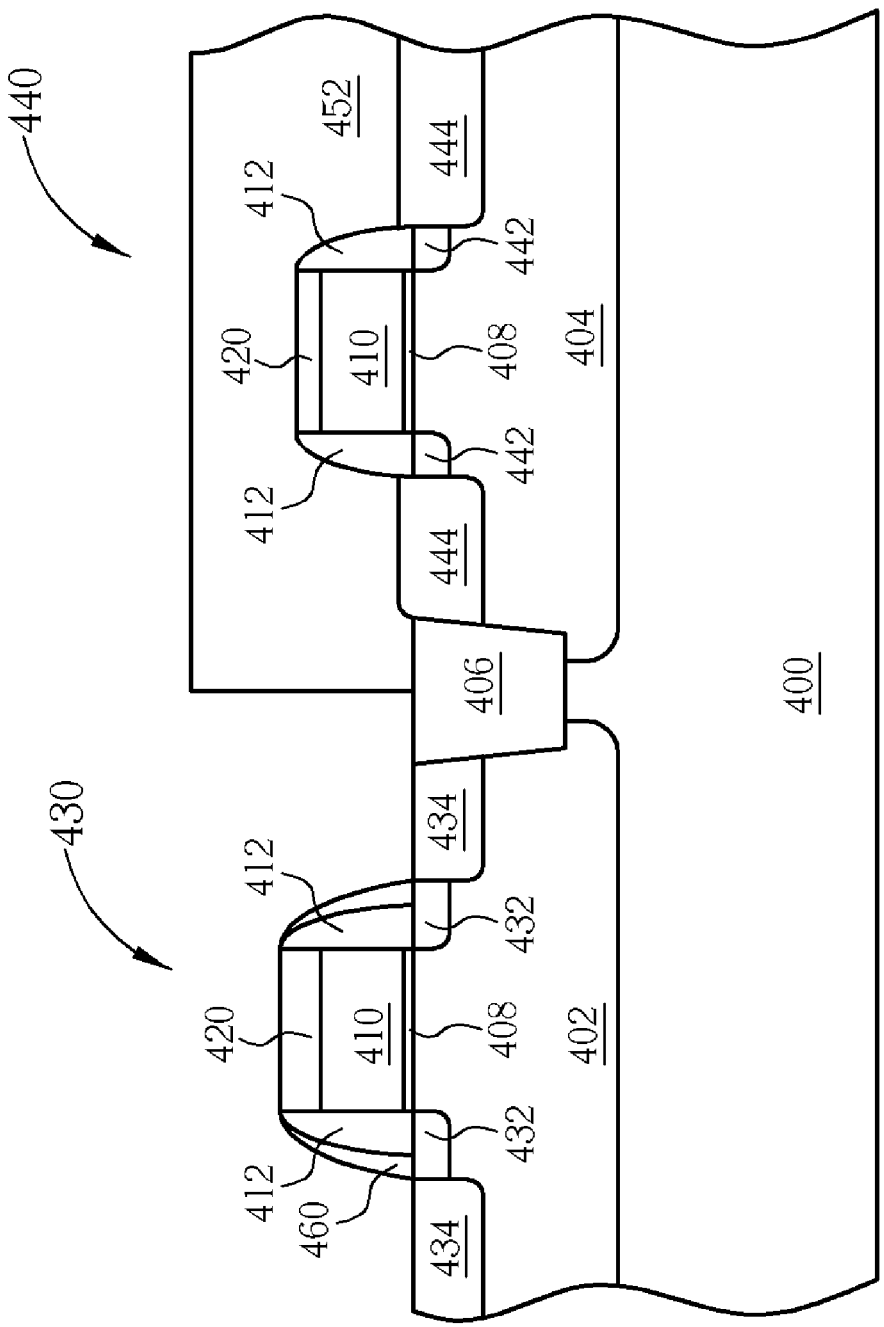

Please refer to FIGS. 18-19. A SEG process is performed to form epitaxial silicon layers 472 in each recess 470. As shown in FIG. 18, then a source/drain formation process is performed. A patterned first photoresist 450 exposing the second type well 404 is formed on the substrate 400. Performing a first ion implantation step to form a second type source/drain area 444 in the substrate 400 at two sides of the second type gate structure 440 through the patterned first photoresist 450. As shown in FIG. 19, after removing the patterned first photoresist 450, a patterned second photoresist 452 exposing the first type well 402 is formed on the substrate 400. The patterned cap layer 460 is entirely or partially removed from the first type well 402. A second ion implantation step is performed to form a first type source/drain area 434 in the substrate 400 at two sides of the first type gate structure 430 through the patterned second photoresist 452. It is noteworthy that the patterned photoresist 452 is used as an etching mask in an etching back process performed before the second ion implantation step. The etching back process is used to thin down the hard mask layer 420 covering the first type gate structure 430. The etch back process can alternatively be performed after the second ion implantation step which amorphizes the hard mask layer 420 and makes the hard mask layer 420 obtain a higher wet etching ratio. After removing the patterned second photoresist 452, a wet cleaning step comprising a DHF is performed to remove any remaining photoresist. The hard mask layer 420 is thinned in a range of 0-400 angstroms in the etching back process. The etching back process comprises a wet etching process utilizing a DHF or a dry etching process such as a RIE, an ion beam etching, a plasma etching, or a laser ablation.

Figure 20:
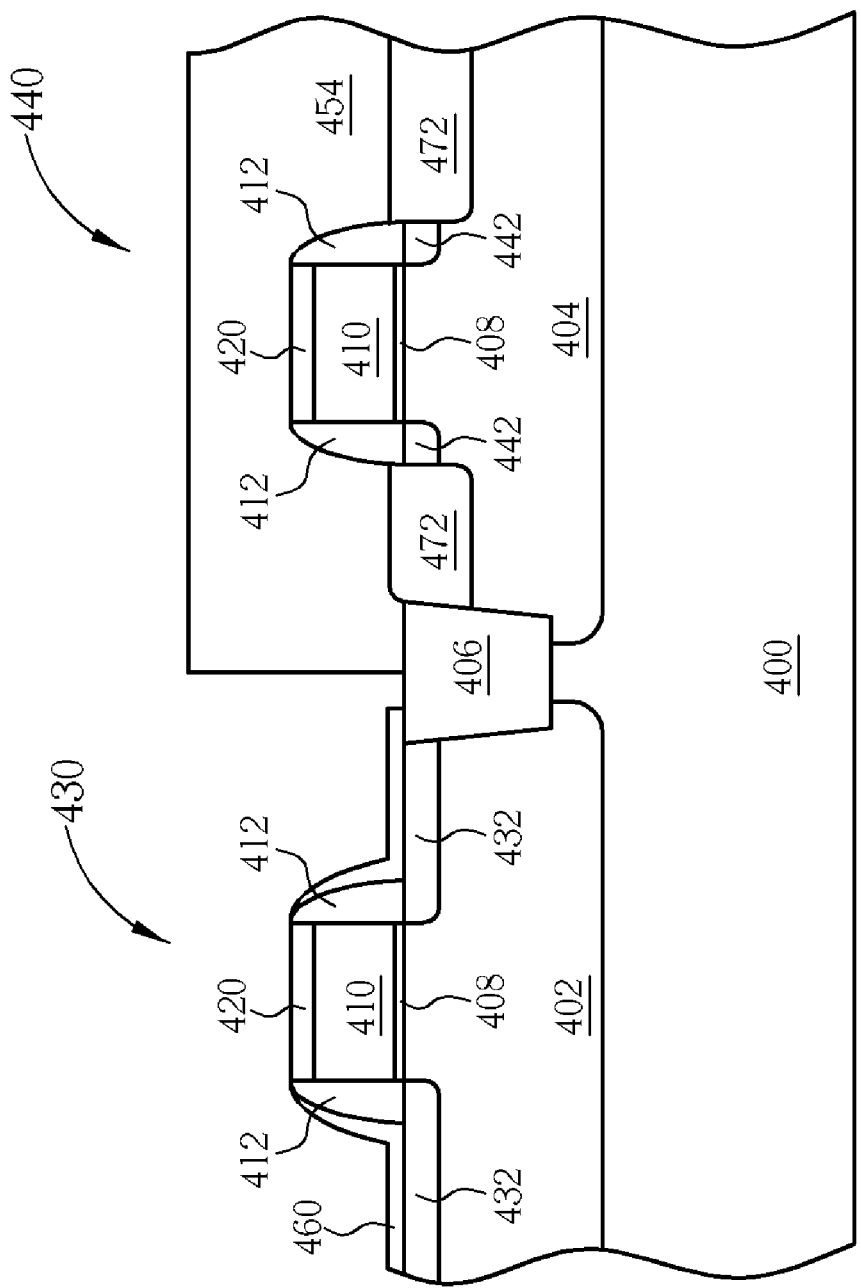

Please refer to FIG. 20. In the third preferred embodiment, the etching back process can be performed before the source/drain formation process. As shown in FIG. 20, after forming the epitaxial silicon layer 472, a patterned third photoresist 454 exposing the first type well 402 is formed on the substrate 400. The patterned third photoresist 454 functions as an etching mask in the etching back process, which is performed to thin down the patterned cap layer 460 and the hard mask layer 420 covering the first type gate structure 430. The etching back process is followed by the source/drain formation process.

Figure 21:
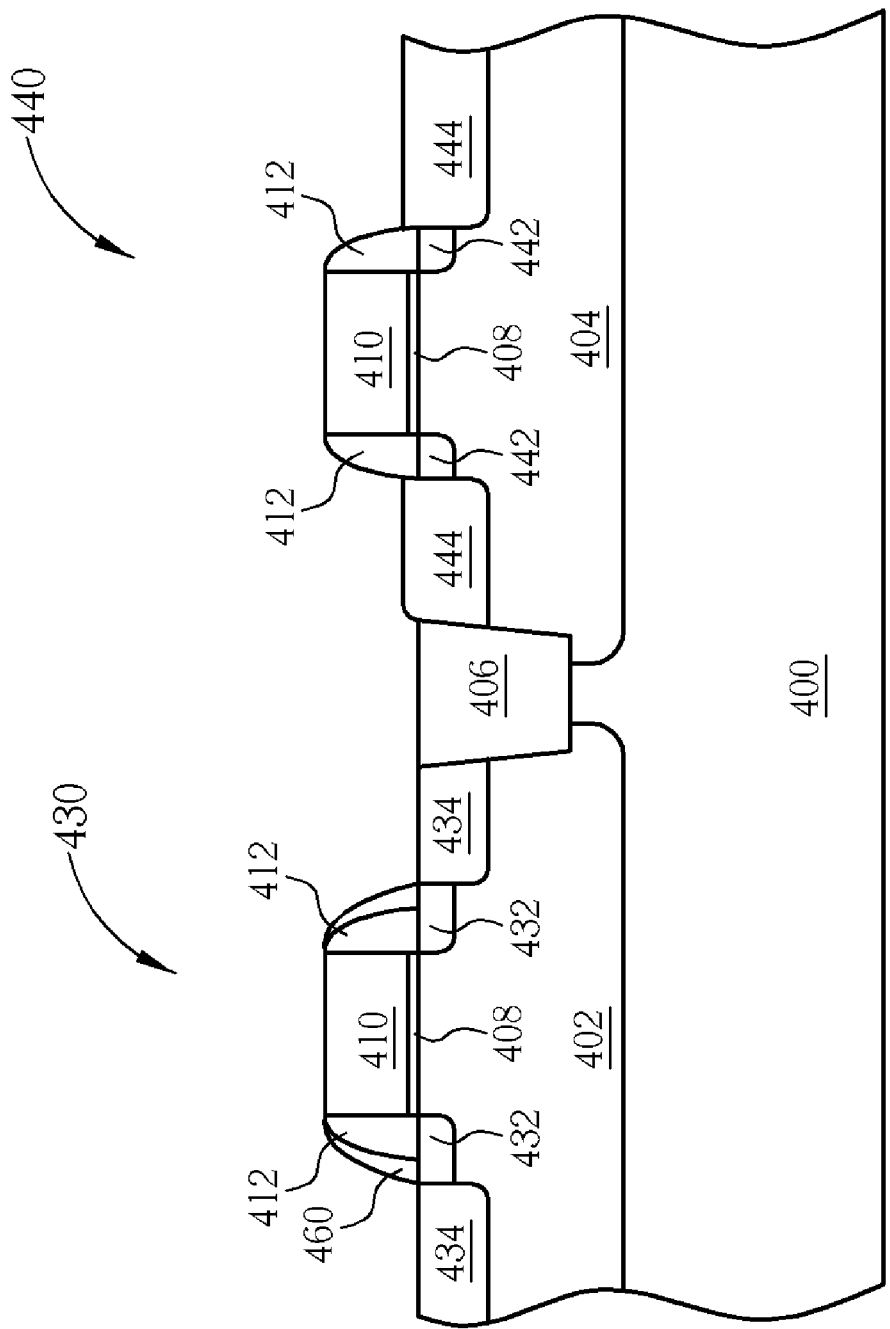

Please refer to FIG. 21. The patterned cap layer 460 and the hard mask layer 420 are entirely removed for following processes such as a salicide process.

Please refer to FIG. 17 again. Please note that consumption of the hard mask layer 420 covering the second type gate structure 440 occurs not only in the recess 470 etching, but also in a cleaning step after forming the recess 470 and a cleaning step before SEG process. Therefore a thickness deviation between the hard mask layers 420 covering the first type gate structure 430 and the second type gate structure 440 is obtained in the prior art. However, since the hard mask layer 420 covering the first type gate structure 430 is thinned in the etching back process, such thickness deviation is reduced according to the third preferred embodiment. When the hard mask layers 420 and the patterned cap layer 460 are removed for following processes, liner oxide of the spacers 412, the STI 406, and profile of the second type gate structure 440 will not be damaged for removing the thicker hard mask layer 420. Therefore peeling of the spacer 412 is prevented. And damages to the STI 406 which lead to silicide layer formed under the STI 406 and cause current leakage is also avoided.

Additionally, in the third preferred embodiment, when the first type well 402 is a P-type well and the second type well 404 is an N-type well, the first type LDDs 432 are N-type LDDs and the second type LDDs 442 are P-type LDDs, the first type source/drain area 434 is an N-type source/drain area and the second type source/drain area 444 is a P-type source/drain area, and the epitaxial layer 472 comprises SiGe. When the first type well 402 is an N-type well and the second type well 404 is a P-type well, the first type LDDs 432 are P-type LDDs and the second type LDDs 442 are N-type LDDs, the first type source/drain area 434 is an P-type source/drain area and the second type source/drain area 444 is a N-type source/drain area, and the epitaxial layer 472 comprises SiC.

Figure 22:
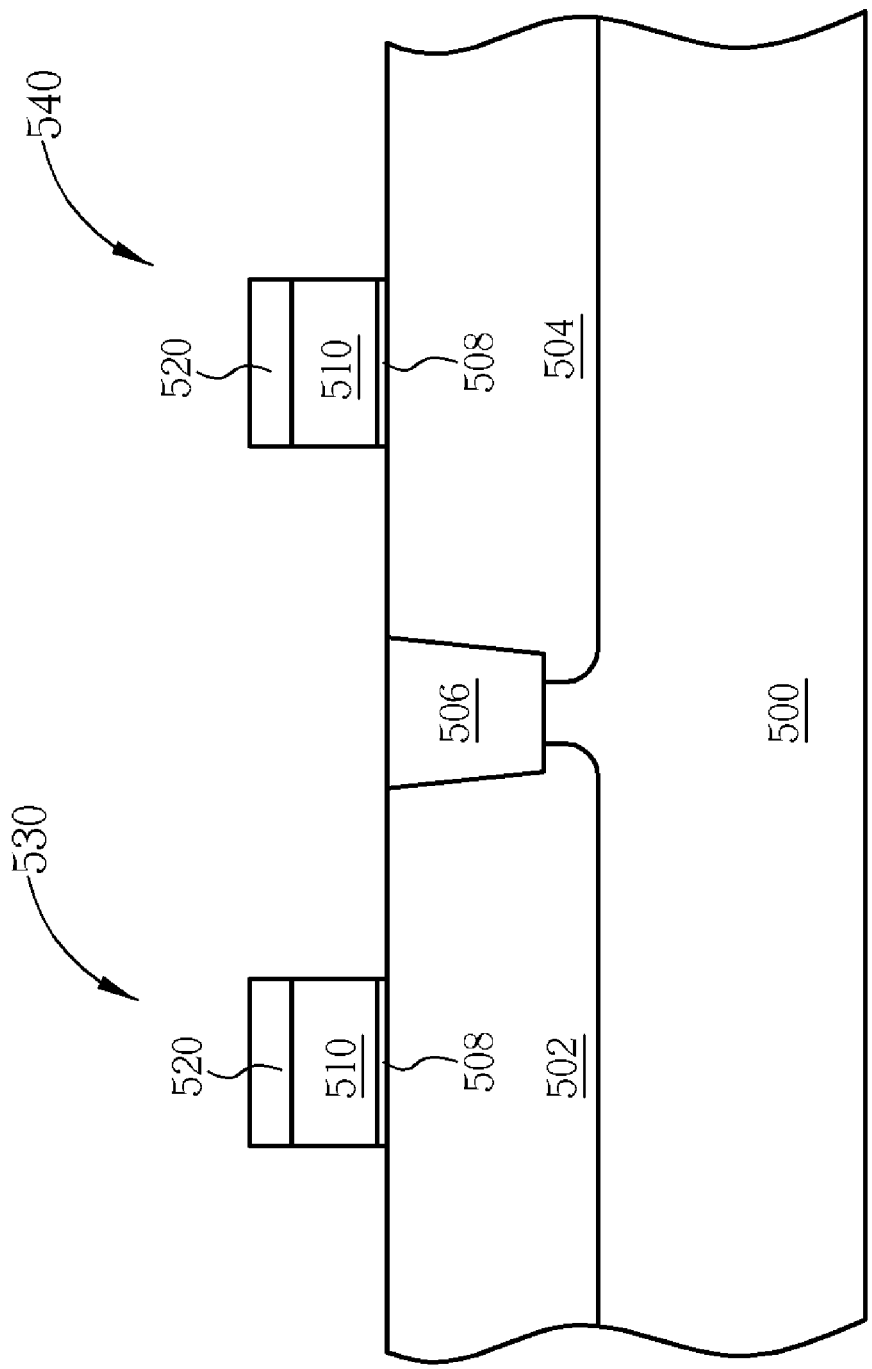
FIGS. 22-24 are schematic drawings illustrating a method for manufacturing CMOS transistors according to a fourth preferred embodiment.
Figure 23:
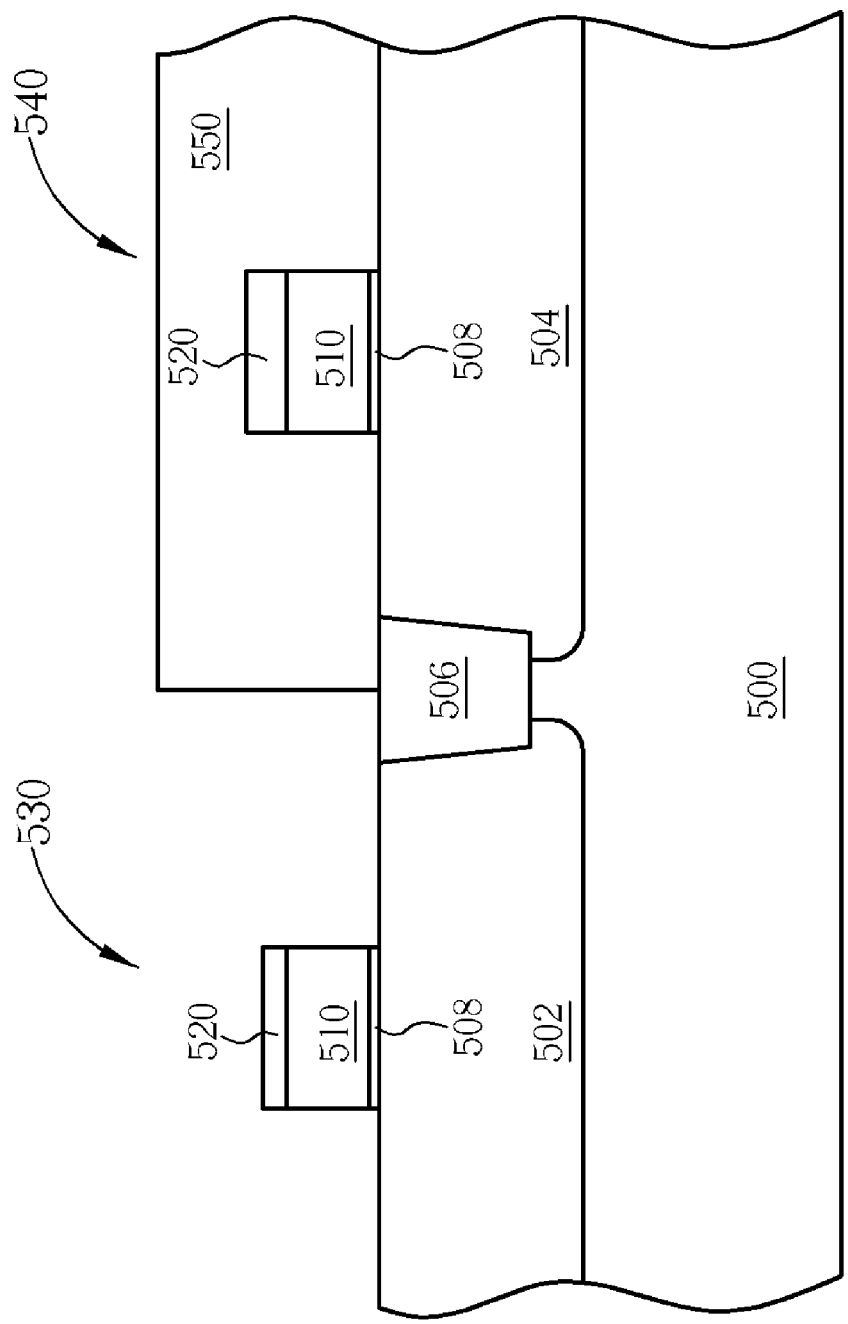
Figure 24:
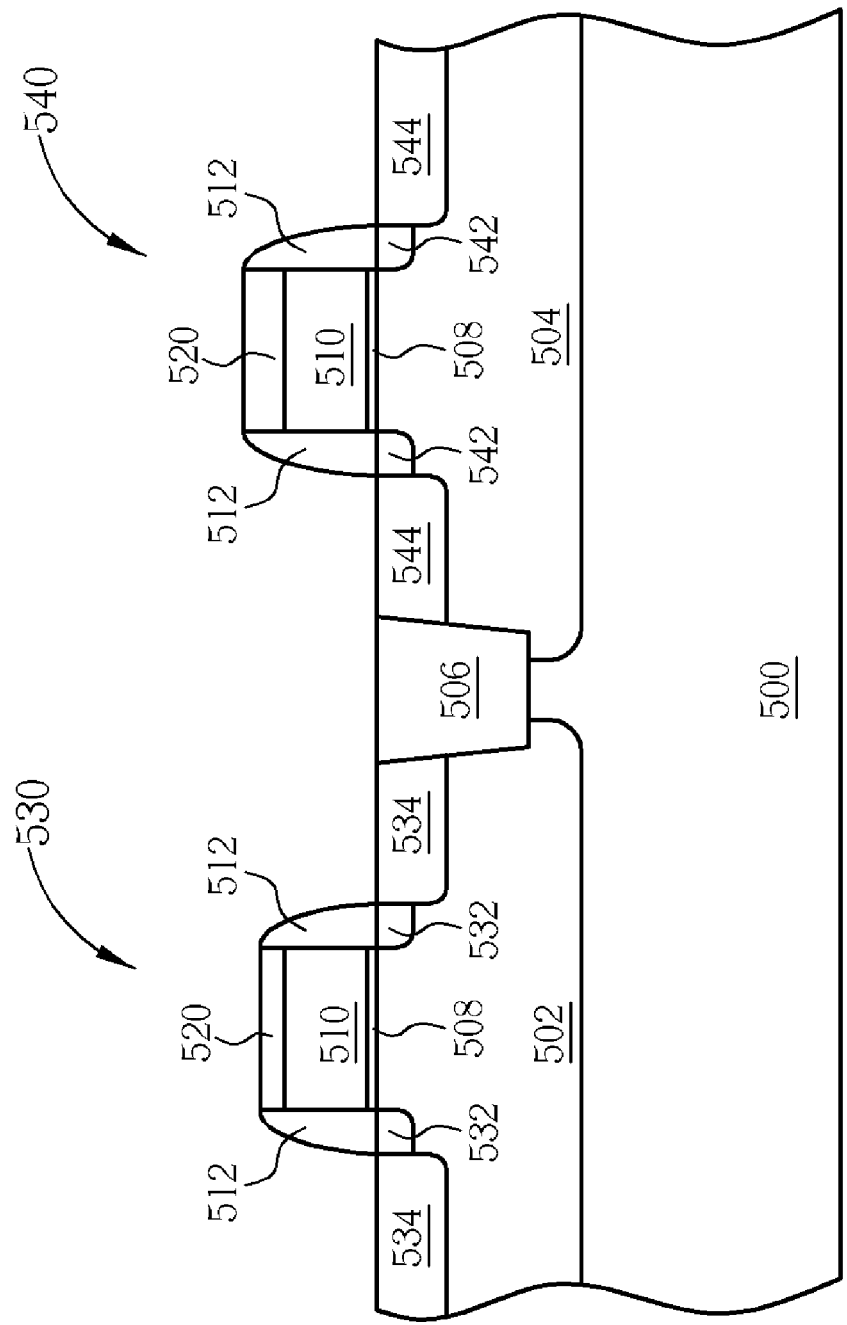

Please refer to FIGS. 22-24, which are schematic drawings illustrating a method for manufacturing CMOS transistors according to a fourth preferred embodiment. As shown in FIG. 22, a substrate 500 comprises a first active area such as a first type well 502, a second active area such as a second type well 504, and a STI 506 formed in between is firstly provided. A first type gate structure 530 and a second type gate structure 540 are formed respectively in the first type well 502 and the second type well 504. Each gate structure 530 and 540 comprises a gate dielectric layer 508, a gate conductive layer 510, and a hard mask layer 520 comprising $SiO_2$, SiN, SiON, SiCN, SiC, SiOC, or SRN. The hard mask layer 520 used to define a position of the gate conductive layer 510 and to protect the gate conductive layer 510 in following etching and cleaning processes is deposited on the gate conductive layer 510 by a CVD process such as a PECVD process, a SACVD process, or a LPCVD process. The hard mask layer 520 has a thickness of about 400-600 angstroms.

Please refer to FIG. 23. Next, a patterned photoresist 550 exposing the first type well 504 is formed on the substrate 500. An etching back process is performed with the patterned photoresist 550 being an etching mask to thin down the hard mask layer 520 covering the first type gate structure 530. The hard mask layer 520 is thinned in a range of 0-400 angstroms in the etching back process. The etching back process comprises a wet etching process utilizing a DHF or a dry etching process such as a RIE, an ion beam etching, a plasma etching, or a laser ablation.

Please refer to FIG. 24. After performing the etching back process and removing the patterned photoresist 550, conventional LDD implantation processes are performed to form first type LDDs 532 in the substrate 500 respectively at two sides of the first type gate structure 530 and to form second type LDDs 542 in the substrate 500 respectively at two sides of the second type gate structure 540. Then, spacers 512 are formed on sidewalls of each gate structure 530 and 540, respectively. And conventional source/drain formation processes are performed to form a first type source/drain area 534 in the substrate 500 respectively at two sides of the first type gate structure 530 and to form a second type source/drain area 542 in the substrate 500 respectively at two sides of the second type gate structure 540. Next, a patterned cap layer having a thickness of about 150-250 angstroms is formed on the first type well 502, performing an etching process to form recesses in the substrate 500 at two sides of the second type gate structure 540, performing a SEG process to form epitaxial silicon layers in each recess, and removing the patterned cap layer and the hard mask layers 520. And a salicide process can be performed according to the process requirement. Because the processes are the same with the first preferred embodiment, further description of the process is omitted in the interest of brevity in the second embodiment.

As mentioned above, in the fourth preferred embodiment, when the first type well 502 is a P-type well and the second type well 504 is an N-type well, the first type LDDs 532 are N-type LDDs and the second type LDDs 542 are P-type LDDs, the first type source/drain area 534 is an N-type source/drain area and the second type source/drain area 544 is a P-type source/drain area, and the epitaxial layer comprises SiGe. When the first type well 502 is an N-type well and the second type well 504 is a P-type well, the first type LDDs 532 are P-type LDDs and the second type LDDs 542 are N-type LDDs, the first type source/drain area 534 is an P-type source/drain area and the second type source/drain area 544 is a N-type source/drain area, and the epitaxial layer comprises SiC.

Please note that consumption of the hard mask layer 520 covering the second type gate structure 540 occurs not only in the recess etching, but also in a cleaning step after forming the recess and a cleaning step before SEG process. Therefore a thickness deviation between the hard mask layers 520 covering the first type gate structure 530 and the second type gate structure 540 is obtained in the prior art. However, since the hard mask layer 520 covering the first type gate structure 530 is thinned in the etching back process, such thickness deviation is reduced according to the fourth preferred embodiment. When the hard mask layers 520 and the patterned cap layer are removed for following processes, liner oxide of the spacers 512, the STI 506, and profile of the second type gate structure 540 will not be damaged for removing the thicker hard mask layer 520. Therefore peeling of the spacer 512 is prevented. And damages to the STI 506 which lead to silicide layer formed under the STI 506 and cause current leakage is also avoided.

In summary, according to the method for manufacturing CMOS transistors provided by the present invention, an etching back process is alternatively performed after the gate structure formation, the LDD implantation, the source/drain formation, or the SEG process to etch the hard mask layer covering a first type gate structure and to reduce thickness deviation between the hard mask layers covering the first type gate structure and the second type gate structure. Therefore the damage to the spacers, the STIs, and the profile of the gate structures due to the thickness deviation is prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing complementary metal oxide semiconductor (CMOS) transistors comprising steps of:
    providing a substrate having at least a first type gate structure and a second type gate structure, each of the gate structures comprising a gate dielectric layer, a gate conductive layer, and a hard mask layer;
    performing a source/drain formation process to form a first type source/drain area in the substrate at two sides of the first type gate structure and a second type source/drain area in the substrate at two sides of the second type gate structure;
    performing an etching back process to etch back and thin down the hard mask covering the first type gate structure;
    performing an etching process to form recesses in the substrate respectively at two sides of the second type gate structure through a patterned cap layer; and
    performing a selective epitaxial growth (SEG) process to form epitaxial silicon layers in each recess.

2. The method of claim 1 further comprising a lightly doped drain (LDD) implantation process for forming first type LDDs in the substrate at two sides of the first type gate structure and second type LDDs in the substrate at two sides of the second type gate structure.

3. The method of claim 2 further comprising a step of forming a spacer on sidewalls of each gate structure.

4. The method of claim 1, wherein the hard mask layer comprises silicon oxide (SiO), silicon nitride (SiN), silicon oxynitride (SiON), silicon carbon nitride (SiCN), silicon carbide (SiC), silicon oxycarbide (SiOC), or silicon-rich-nitride (SRN).

5. The method of claim 1, wherein the hard mask layer has a thickness of 400-600 angstroms.

6. The method of claim 5, wherein the hard mask layer is thinned in a range of 0-400 angstroms in the etching back process.

7. The method of claim 1, wherein the source/drain formation process further comprises:
performing a first ion implantation step to form the second type source/drain area through a patterned first photoresist;
removing the patterned first photoresist;
performing a second ion implantation step to form the first type source/drain area through a patterned second photoresist;
removing the patterned second photoresist; and
performing a wet cleaning step to remove remaining patterned photoresists with a dilute HF (DHF).

8. The method of claim 7, wherein the etching back process is performed after forming the patterned second photoresist to thin down the hard mask layer covering the first type gate structure with the patterned second photoresist being an etching mask.

9. The method of claim 7, wherein the etching back process is performed after the second ion implantation step to thin down the hard mask layer covering the first type gate structure with the patterned second photoresist being an etching mask.

10. The method of claim 1, wherein the etching back process comprises a wet etching process or a dry etching process.

11. The method of claim 1, wherein the patterned cap layer has a thickness of 150-250 angstroms.

12. The method of claim 1 wherein the first type gate structure and the second type gate structure are positioned in a first active area and a second active area of the substrate respectively, and the first active area and the second active area is electrically isolated from each other by a shallow trench isolation (STI).

13. The method of claim 12, wherein the first active area is a P-type well and the second active area is an N-type well.

14. The method of claim 13, wherein the first type LDDs are N-type LDDs and the second type LDDs are P-type LDDs.

15. The method of claim 13, wherein the first type source/drain area is an N-type source/drain area and the second type source/drain area is a P-type source/drain area.

16. The method of claim 13, wherein the epitaxial layer comprises silicon germanium (SiGe).

17. The method of claim 12, wherein the first active area is an N-type well and the second active area is a P-type well.

18. The method of claim 17, wherein the first type LDDs are P-type LDDs and the second type LDDs are N-type LDDs.

19. The method of claim 17, wherein the first type source/drain area is a P-type source/drain area and the second type source/drain area is an N-type source/drain area.

20. The method of claim 17, wherein the epitaxial layer comprises silicon carbide (SiC).

21. The method of claim 1 further comprising a step of removing the patterned cap layer and the hard mask layers.

22. The method of claim 21 further comprising a step of performing a silicide process after removing the patterned cap layer and the hard mask layers.

* * * * *